(12) United States Patent
Goldman

(10) Patent No.: US 6,466,058 B1
(45) Date of Patent: Oct. 15, 2002

(54) PLL LOCK DETECTION USING A CYCLE SLIP DETECTOR WITH CLOCK PRESENCE DETECTION

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/016,265

(22) Filed: Dec. 10, 2001

(51) Int. Cl.[7] .................................................. H03K 9/06
(52) U.S. Cl. ............................ 327/49; 327/156; 327/163
(58) Field of Search .............................. 327/47–49, 156, 327/158, 159, 161–163, 3, 7, 12; 375/376

(56) References Cited

U.S. PATENT DOCUMENTS

| | | |
|---|---|---|
| 6,037,806 A | 3/2000 | Smith et al. |
| 6,133,769 A | 10/2000 | Fontana et al. |
| 6,404,240 B1 * | 6/2002 | Hakkal et al. ............... 327/12 |

\* cited by examiner

*Primary Examiner*—Kenneth B. Wells
(74) *Attorney, Agent, or Firm*—Ronald O. Neerings; Wade James Brady, III; Frederick J. Telecky, Jr.

(57) ABSTRACT

A system 400 and method 1400 are disclosed for a lock detection circuit of a phase locked loop used in a communications device. The lock detection circuit includes a cycle slip detector and a clock presence detector. The cycle slip detector receives a reference clock and a VCO feedback clock, and in response to the frequency difference between the reference clock and the VCO feedback clock that remains for a time period greater than the inverse of the frequency difference of the clocks, generates a no cycle slips alarm indication. The no cycle slips alarm status enables the lock detection circuit to provide an indication to the PLL, of the lock condition and whether a cycle slip has occurred. The clock presence detector receives the reference clock and the VCO feedback clock, and in response to determining whether the reference clock or the VCO feedback clock is missing for a time greater than a predetermined count of either remaining clock, generate a no VCO alarm and a no REF alarm indication. The no VCO alarm and the no REF alarm enables the lock detection circuit to provide an alarm indication to the PLL of the presence of the reference clock and the VCO feedback clock.

13 Claims, 17 Drawing Sheets

| Reference Clk (REF_CLK) | Divided Fdbk VCO Clk (FB_VCO) | Cycle slips (Output) (CYCLESLIPS) |
|---|---|---|
| 0 | T | H |
| T | 0 | H |
| 0 | 0 | H |
| 1 | T | H |
| T | 1 | H |
| 1 | 1 | H |
| Ref > Fdbk VCO | T | T (Normal) |
| Ref < Fdbk VCO | T | T (Normal) |
| Ref = Fdbk VCO | T | H (Normal) |

PLL LOCK DETECTION USING A CYCLE SLIP DETECTOR WITH CLOCK PRESENCE DETECTION

TECHNICAL FIELD OF INVENTION

The present invention relates generally to the field of phase locked loops, and more specifically to a lock detection circuit using a cycle slip detector with clock presence detection, permitting a large variation of the clock phase or frequency and adequate time for the PLL to react to the disturbance without causing false alarms, while providing an alarm to PLL behavior consistent with a significant deviation from the lock condition in a small, low power and low noise digital solution.

BACKGROUND OF THE INVENTION

The phase lock loop (PLL) is commonly used in digital circuitry to provide precise phase and frequency locking and synchronization of clock signals. Applications include, for example, anything requiring clock synchronization or clock synthesis, such as data transmission and telecommunications.

FIG. 1 illustrates a typical PLL circuit of a prior art. The PLL 100 of FIG. 1 includes a phase/frequency detector 110, a charge pump 120, a loop filter 130, a voltage controlled oscillator (VCO) a buffer inverter 150 for the VCO output PLL_OUT, and a frequency divider 160. The phase/frequency detector 110 compares the phase and frequency of an input reference clock signal REF_CLK with those of a feedback signal FB_VCO and in response generates phase/frequency correction signals for the charge pump 120. The phase/frequency correction signals comprise an Up signal and a Down signal transmitted on two separate signal paths. The Up and Down signals depend upon the relationship of the phase of the feedback signal FB_VCO to the input clock signal REF_CLK. For example, when the input clock signal REF_CLK and the feedback signal FB_VCO are in a perfect phase lock, the Up and Down signals generated by the phase/frequency detector 110 have perfectly matched pulses with an equal pulse width, as shown in FIG. 2A.

FIG. 2B shows the pulses of the up and down signals when an up shifting of the phase locked loop output signal PLL_OUT is required to enable the feedback signal FB_VCO to be phase locked with the input clock signal REF_CLK. In this case, the pulse width of the up signal is greater than that of the down signal. Only the leading edges of the corresponding pulses of the up an down signal are timed to coincide with each other, whereas the trailing edges of the up signal pulses lag behind those of the corresponding down signals pulses and vary with the timing difference between the clocks input to the phase/frequency detector 110.

FIG. 2C shows the pulses of the up and down signals when a downshifting of the phase locked loop output signal PLL_OUT is required to enable the feedback signal FB_VCO to be phase locked with the input clock signal REF_CLK. In this situation, the pulse width of the down signal is greater than that of the up signal. Here, only the trailing edges of the corresponding pulses of the up an down signal are timed to coincide with each other, whereas the leading edges of the down signal pulses lead ahead those of the corresponding up signals pulses and vary with the timing difference between the clocks input to the phase/frequency detector 110.

Referring back to FIG. 1, the charge pump 120 generates a pump current $I_C$ in response to receiving the up and down signals from the phase/frequency detector 110. The charge pump 120 detects a difference between the pulse width of the up and down signals generated by the phase/frequency detector 110 and adjusts the pump current $I_C$ if the pulses of the up and down signals do not match each other. For example, when the input clock signal REF_CLK and feedback signal FB_VCO are in a perfect phase lock and the up and down signal pulses are perfectly matched as shown in FIG. 2A, no phase or frequency shift in the output signal PLL_OUT is required, and therefore no change in the pump current $I_C$ is required.

In the case in which the phase/frequency detector 110 outputs up and down signal pulses as shown in FIG. 2B, the charge pump 120 determines that the pulse width of the up signal is greater than that of the down signal and in response adjusts the pump current $I_C$ upward to increase the frequency $F_{HI}$ of the output signal PLL_OUT, such that the frequency of the feedback signal FB_VCO is increased to achieve a phase lock with the input clock signal REF_CLK. In the case in which the phase/frequency detector 110 outputs up and down signal pulses as shown in FIG. 2C, the charge pump 120 determines that the pulse width of the down signal is greater than that of the up signal and in response adjust the pump current $I_C$ downward to decrease the frequency of the output signal PLL_OUT in order to achieve a phase lock between the signals REF_CLK and FB_VCO.

In this way, the conventional PLL is able to react to a limited phase difference between the input reference clock and the feedback VCO clock in order to regain frequency lock. Generally, for example, this allowable phase difference is less than 360 degrees.

The loop filter 130 in FIG. 1 may be either a conventional passive loop filter or a conventional active loop filter which filters out undesirable noises and high frequency jitters in the pump current signal $I_C$ generated by the charge pump 120.

The loop filter 130 outputs a control voltage $V_C$ to the VCO 140, which in response generates a phase locked loop output signal PLL_OUT having a typically high output frequency $F_{HI}$. The output frequency $F_{HI}$ generated by the VCO 140 is dependent upon the control voltage $V_C$. In a PLL feedback loop, the conventional PLL 100 may include a frequency divider 160 which divides the output frequency $F_{HI}$ of the PLL by a predetermined divisor M, to generate the feedback signal FB_VCO, which is typically divided down to a lower frequency $F_{LO}$. The divisor M, that is, the ratio of the frequency $F_{HI}$ of the PLL output signal PLL_OUT to the frequency $F_{LO}$ of the feedback signal FB_VCO, is determined by the desired frequency $F_{HI}$ of the output signal PLL_OUT relative to the frequency of the input clock signal REF_CLK.

When the input clock signal REF_CLK is initially provided to the phase/frequency detector 110 in the conventional PLL as shown in FIG. 1, the control voltage $V_C$ from the loop filter 130 may take a finite time before it settles to a steady-state voltage level to achieve a phase lock. FIG. 3 illustrates a typical curve of the loop filter control voltage vs. time ($V_C$ vs. t) 180, which shows the magnitude of the loop filter control voltage $V_C$ from the time of starting the input clock signal REF_CLK at $V_{CI}$ (initial control voltage) to the time of achieving a steady-state voltage $V_{CF}$ (final control voltage) at point C. Prior to the steady-state point C, the loop filter control voltage $V_C$, which controls the frequency $F_{HI}$ of the PLL output signal PLL_OUT, may overshoot A and undershoot B again due to relatively large variations in the up and down signals from the phase/frequency detector 110 shortly after the phase locking operation is initiated. In addition, the initial control voltage $V_{CI}$ corresponds to an initial VCO starting frequency which may be very low. Therefore, the time required $t_{LOCK}$, for the PLL to achieve lock after the REF_CLK signal is initially applied, may involve a substantial delay.

Additionally, during a transient state prior to achieving the steady state frequency, the control voltage $V_C$ may cause the conventional PLL as shown in FIG. 1 to achieve a "false phase lock" condition as $V_C$ crosses the final control voltage set point $V_{CF}$, yet is still in a transient state until the voltage level of $V_C$ stabilizes in correspondence with the feedback.

In order to avoid data errors which may occur due to a false lock from a PLL, prior art using fixed time delays have been provided after the clock start. However, a fixed time delay does not ensure a true phase lock because the duration of the transient state prior to achieving the steady state will not be the same for each phase locking operation because of the nonlinear nature of locking. A very long delay to assure that false locks do not occur is also undesirable due to fast circuit start up time requirements for many circuits.

PLL 100 further includes a lock detector 170 which also uses the input clocks REF_CLK and FB_CLK. The lock detector 170 determines whether input clock signals are in phase or out-of-phase (not locked), and may provide a visible indication of the condition to a user.

Many conventional PLL systems also use a lock detector circuit to do a system reset. A reset, however, is a disastrous change to the operation of most systems. In a PLL, a reset can start the loop operating at a very low frequency (as indicated by $V_{CI}$ in FIG. 1, or even no output) and then acquiring lock at the normally much higher output operating frequency. Consequently, a small phase shift in a PLL that would marginally effect the system can cause a huge disruption in the operation of the system from a reset. Normal operations of a PLL can respond to a disturbance in a manner that makes it appear defective.

Quadrature phase detector, time window edge comparison, tune voltage window comparator, and cycle slip detection are the most common methods for lock detection. A tune voltage window comparator would significantly reduce the output frequency range because of the variation of voltage trip points with process, temperature, and voltage.

Except for the tune voltage window comparator, these lock detection schemes require the presence of the reference and divided down VCO clocks. A loss of one of the clocks causes the PLL to give a false alarm.

Accordingly, there is a need for a lock detection circuit of a phase locked loop which permits a large variation of the clock phase or frequency and adequate time for the PLL to react to the disturbance without causing false alarms, while providing an alarm to PLL behavior consistent with a significant deviation from the lock condition in a small, low power and low noise digital solution.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a lock detection circuit of a phase locked loop used in a communications device. The purpose of the lock detection circuit according to an exemplary aspect of the present invention, is to alarm on behavior that shows the PLL has had a significant deviation from the lock condition. Conventional operations of a PLL can respond to a disturbance in a manner that makes it appear defective. Consequently, the best lock detection schemes will allow some time for the loop to respond to a disturbance and recover. In this way, a system reset or the false alarms previously discussed may be avoided.

To accomplish this, the lock detection circuit of the present invention includes a cycle slip detector and a clock presence detector. With the innovative use and combination of these detector circuits, the present invention intends to redefine the PLL from a simple phase (e.g., typically <90 degrees) locking device, to one which includes multiple cycles (e.g., 16 cycles of 360 degrees each) and frequency locking capabilities.

In the process of this redefining, some terms will also be defined. The lock detection circuit, according to the present invention, continuously monitors the reference clock, the feedback VCO clock, and determines the phase and cycle (360 degrees) count difference between these clocks following the last point of phase lock (when the clocks were at the same frequency and phase). The lock detection circuit determines the total phase and cycle difference between the reference clock and the feedback VCO clock signals;

360 degrees phase difference=1 cycle slip in terms of reference clock counts since the last cycle slip. This reference clock count is then, at the desired PLL lock frequency, also a measure of the total elapsed time since the last cycle slip. A 4 bit counter, for example, within the lock detection circuit is coupled to the output of the cycle slip detector to store the reference clock count (e.g., 16 counts maximum for a 4 bit counter). After a cycle slip occurs, the counter resets to a count of 0, and outputs a CYCLE SLIP alarm indication for the PLL. On the other hand, if the PLL does regain lock without a cycle slip, the reference clock counter will continue counting up until the maximum count is attained. At the maximum count, the counter latches and indicates a NO CYCLE SLIPS state indication. In this way, the counter allows time for the PLL to recover from a disturbance without producing false alarm indications, or a PLL reset.

Thus, the cycle slip detector receives a reference clock and a VCO feedback clock, and in response to the frequency difference between the reference clock and the VCO feedback clock that remains for a time period greater than the inverse of the frequency difference of the clocks, generates a cycle slips alarm indication. The cycle slips alarm status enables the lock detection circuit to provide an indication to the PLL, of the lock condition and whether a cycle slip has occurred. The phase difference may be detected, for example, by a phase/frequency detector.

In operation, the cycle slip detector uses a phase/frequency detector which in response to the frequency difference between the reference clock and the VCO feedback clock, generates UP pulses and DOWN pulses, which are coupled into an UP cycle slip detector and a DOWN cycle slip detector respectively. The UP and DOWN cycle slip detectors respond to the beat frequency of the difference between the clocks to produce a pulse when the pulse width of the frequency difference "rolls over" from its largest pulse width to its narrowest pulse width. This roll over occurs with each cycle slip, providing a new cycle slip detection.

A logical AND of the UP and DOWN cycle slips, produces a cycle slip detection which is independent of the clock with the higher frequency. The output of the cycle slip detector, is a cycle slip detection pulse which triggers, for example, a 4 bit counter to track the time since the last cycle slip detection, in terms of reference clock counts up to a maximum of 16 reference clock cycles. In this way, adequate time (e.g., 16 reference clocks) is allowed for the PLL to respond to a disturbance without false alarm indications, or a PLL reset.

The cycle slip detector requires the presence of both the reference clock and the divided down VCO clock (feedback VCO clock), but does not detect the loss of either of these input clocks. With one clock missing, the output of the cycle slip detector stays a constant high, which indicates a locked condition to the following circuitry. In a conventional PLL circuit, for example, the momentary loss of either one of the clock signals gives a false alarm indication. A clock presence detector is therefore provided in the present invention to avoid these false alarms.

While the cycle slip detector continuously monitors the phase difference between the reference clock and the feedback VCO clock for a predetermined elapsed time, the clock presence detector, according to the present invention, continuously monitors for a loss of one of the clocks for a predetermined elapsed time. Advantageously, clock presence may also be detected, for example, by the use of the same, or another phase/frequency detector, thereby providing a commonality of circuitry and/or the usage of fewer components.

Once the clock presence detector has detected the loss of a clock signal, the other remaining clock (reference clock, or feedback VCO clock) is counted in, for example, another 4 bit counter. This remaining clock count is then, at the desired PLL lock frequency, also a rough measure of the total elapsed time that the clock has been missing. Therefore, the remaining clock count (e.g., 16 clock cycles for a 4 bit counter) allows for a predetermined correspondence to time for the missing clock to return without false alarm indications, or a PLL reset.

In the event of a catastrophic failure, where both clocks are missing, the result is unknown.

The clock presence detector receives the reference clock and the VCO feedback clock, and in response to determining whether the reference clock or the VCO feedback clock is missing for a time greater than a predetermined count of either remaining clock, generate a no VCO alarm and/or a no REF alarm indication. The no VCO alarm and the no REF alarm enables the lock detection circuit to provide an alarm indication to the PLL of the presence of the reference clock and the VCO feedback clock.

Conventional solutions for the loss of a clock signal would require a significantly larger number of counters for the same accuracy and in addition, need a third reference clock. This third reference clock could inject a signal to the PLL and cause jitter at the output.

Quadrature phase detection, time window edge comparison, tune voltage window comparison, and frequency discrimination are the most common methods for lock detection. Of these, quadrature phase detection, tune voltage window comparison, and frequency discrimination require a significant amount of analog circuitry which would require more chip area and power than the digital solution presented. The tune voltage window comparison detector may generate a number of false alarms because of variations in the phase error of the PLL as the loop corrects for various disturbances.

Thus the innovative lock detector of a phase locked loop permits a large variation of the clock phase or frequency and adequate time for the PLL to react to the disturbance without causing false alarms, while providing an alarm to PLL behavior consistent with a significant deviation from the lock condition, in a small low power and low noise digital solution.

In accordance with the present invention, a lock detector for a phase locked loop is disclosed. The innovative lock detector incorporates the use and combination of a cycle slip detector and a clock presence detector into the present invention, which attempts to redefine the PLL from a simple phase locking device, to one with frequency locking capabilities. The lock detector permits multiple cycles of phase disturbance to be tolerated, without false alarm indications. In addition, the lock detector permits a temporary loss of multiple cycles of a clock to be tolerated, without false alarm indications.

In one exemplary aspect of the invention, both the cycle slip detector and the clock presence detector utilize a phase/frequency detector to monitor the phase and cycle difference between the reference clock and the feedback VCO clock. Thus, a feature of the present invention is that the same phase/frequency detector may be used for each detector as well as the PLL, to provide a commonality of circuitry, minimize the amount of hardware, and the number of spurious signals. In addition, an extra third clock is unnecessary, which minimizes noise coupling to the loop.

An exemplary feature of the circuit of this invention, therefore, provides an all digital solution to provide a technique which has a higher noise immunity than a conventional method.

Additionally, the cycle slip detector of the present invention, allows 360 degrees of phase shift before detecting a cycle slip, which allows enough time for the PLL to react to disturbances without causing a false alarm.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
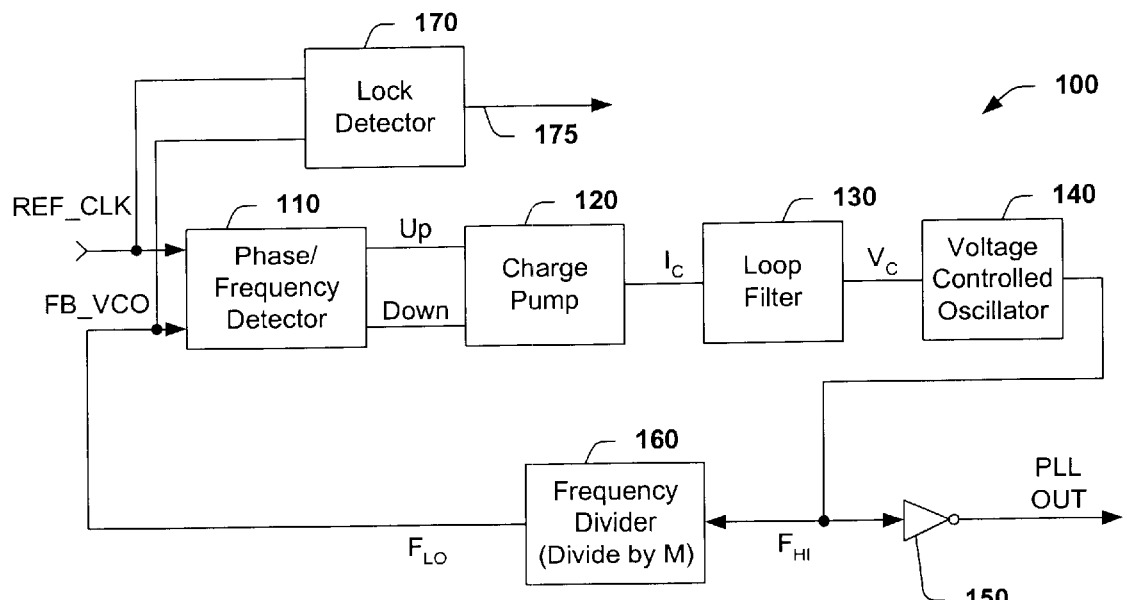
FIG. 1 is a block diagram of a conventional phase locked loop with a lock detector, used to provide phase locking and synchronization of clock signals for data transmission and telecommunications applications.
Figure 3:
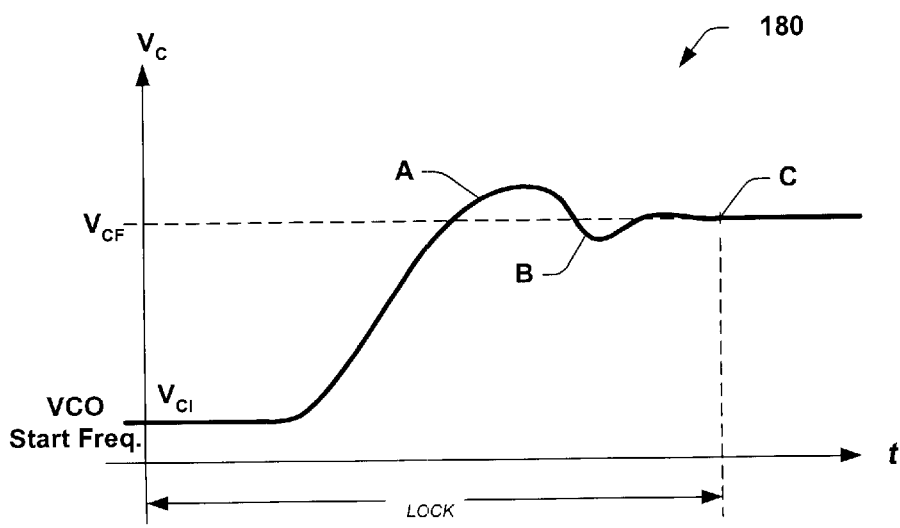
FIG. 3 is a typical curve of a $V_C$ vs time plot illustrating the loop filter control voltage response $V_C$ of a VCO circuit with respect to time after an initial start-up of the VCO.
Figure 2A:
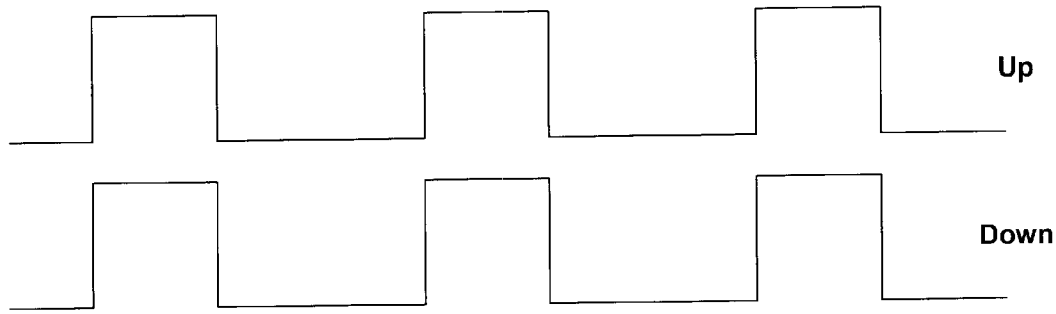
FIG. 2A is a timing diagram of the typical UP and DOWN response pulses generated by the phase/frequency detector, illustrating a perfect lock condition in the conventional PLL circuit of FIG. 1.
Figure 2B:
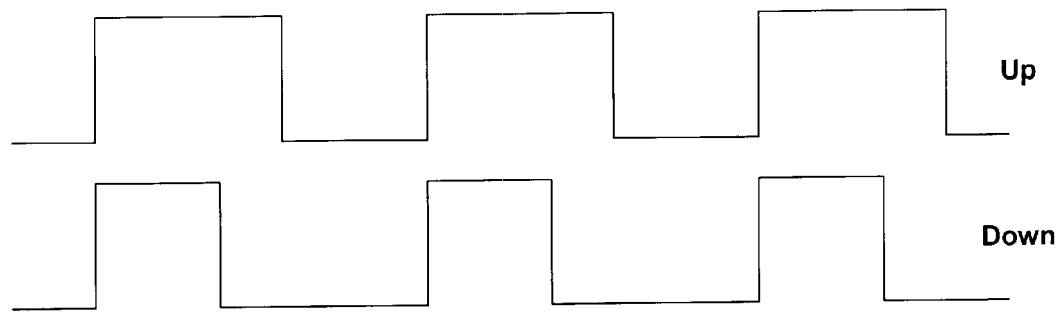
FIG. 2B is a timing diagram of the typical UP and DOWN response pulses generated by the phase/frequency detector, illustrating a condition requiring an up shifting of the output PLL_OUT in the conventional PLL circuit of FIG. 1.
Figure 2C:
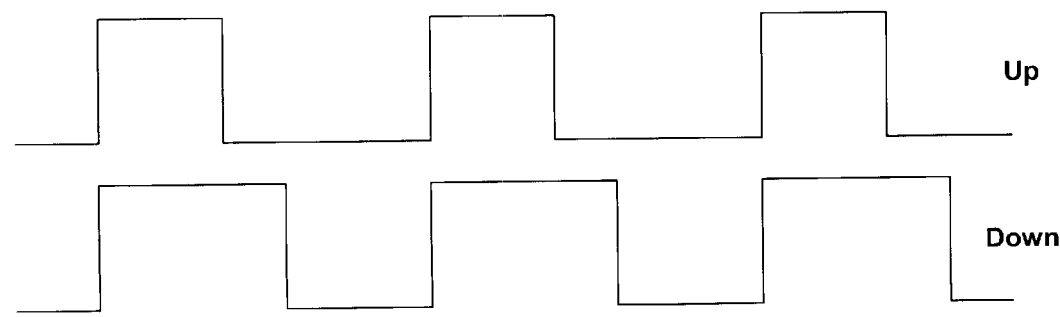
FIG. 2C is a timing diagram of the typical UP and DOWN response pulses generated by the phase/frequency detector, illustrating a condition requiring a downshifting of the output PLL_OUT in the conventional PLL circuit of FIG. 1.

The present invention will now be described with reference to the drawings, wherein like reference numerals are used to refer to like elements throughout. The present invention relates to an innovative lock detection circuit of a phase locked loop used in the field of telecommunications, and for data communications. The lock detection circuit permits a large variation of the clock phase or frequency and adequate time for the PLL to react to the disturbance without causing false alarms, while providing an alarm to PLL behavior consistent with a significant deviation from the lock condition, in a small low power and low noise digital solution.

The lock detection circuit of the present invention, employs the combination of a cycle slip detector and a clock presence detector. The present invention comprises a cycle slip detector which detects the frequency difference between the reference clock and the feedback VCO clock to determine if the frequency difference has remained different for a time period greater than one clock period of this frequency difference (the inverse of the frequency difference). The cycle slip detector generates a pulse to indicate that a cycle slip has occurred when the frequency difference has remained for a time period greater than one clock period of the frequency difference. The cycle slip detection pulse then triggers, for example, a 4 bit counter to track the time since the last cycle slip detection, in terms of reference clock counts up to a maximum of 16 reference clock cycles. In this way, adequate time (e.g., 16 reference clocks) is allowed for the PLL to respond to a disturbance without false alarm indications, or a PLL reset.

The cycle slip detector requires the presence of both the reference clock and the divided down VCO clock (feedback VCO clock), but does not detect the loss of either of these input clocks. With one clock missing, the output of the cycle slip detector stays a constant high, which indicates a locked condition to the following circuitry. In a conventional PLL circuit, for example, the momentary loss of either one of the clock signals gives a false alarm indication.

A clock presence detector is therefore provided in the present invention to avoid these false alarms. The clock presence detector, continuously monitors for a loss of either the reference clock or the feedback VCO clock for a predetermined elapsed time. As discussed, an advantage of this circuit is that clock presence may also be detected, for example, by the use of the same, or another phase/frequency detector, thereby providing a commonality of circuitry and/or the usage of fewer components.

Once the clock presence detector has detected the loss of a clock signal, the other remaining clock (reference clock, or feedback VCO clock) is counted in, for example, another 4 bit counter. This remaining clock count is then, at the desired PLL lock frequency, also a rough measure of the total elapsed time that the clock has been missing. Therefore, the remaining clock count (e.g., 16 clock cycles for a 4 bit counter) allows for a predetermined correspondence to time for the missing clock to return without false alarm indications, or a PLL reset.

In the event of a catastrophic failure, where both clocks are missing, the result is unknown.

Figure 4:
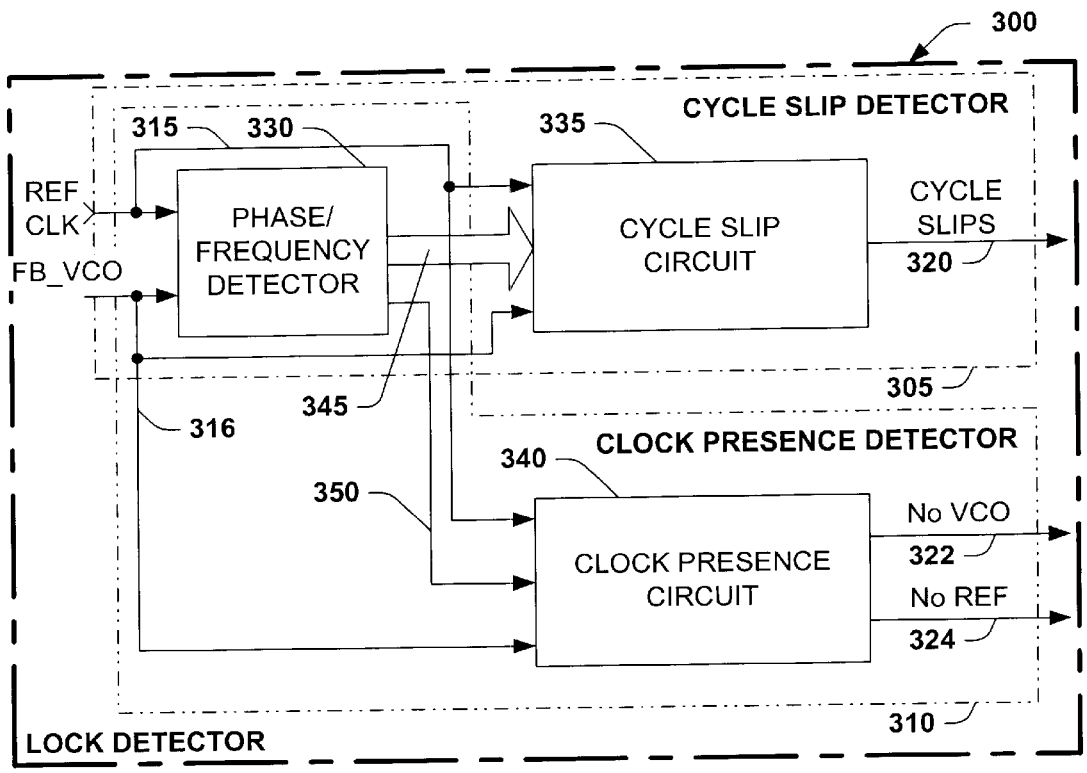
FIG. 4 is a simplified block diagram of an exemplary lock detector, comprising a cycle slip detector and a clock presence detector in which various aspects of the present invention may be carried out.

FIG. 4 is a simplified block diagram of an exemplary lock detector 300, comprising a cycle slip detector 305 and a clock presence detector 310 according to the present invention. The exemplary lock detector 300, receives as inputs, a reference clock REF_CLK 315 and a feedback VCO clock FB_VCO 316, and in response is operable to generate alarm output indications as to whether a cycle slip has occurred (CYCLESLIPS 320), and whether either of the input clocks are missing (No VCO 322, and No REF 324). The feedback VCO clock FB_VCO 316, is the result of the VCO output signal which has been divided down by a divide by M frequency divider in the PLL loop.

The cycle slip detector 305, comprises a phase/frequency detector 330 which is coupled together with a cycle slip circuit 335 and is operable to provide an output indication (CYCLESLIPS 320) whether a cycle slip has occurred. The clock presence detector 310, also comprises a phase/frequency detector 330 (e.g., the same phase/frequency detector) which is coupled together with a clock presence circuit 340 to provide output indications (No VCO 322, and No REF 324) whether either of the input clocks are missing.

The phase/frequency detector 330, of the exemplary lock detector 300, receives the reference clock REF_CLK 315 and the feedback VCO clock FB_VCO 316, as inputs, and in response to the frequency difference generates UP pulses and DOWN pulses 345, and UP reset (UP_RST) and DOWN reset (DN_RST) pulses all via 345. In addition to the input clocks REF_CLK 315 and FB_VCO 316, the clock presence circuit 340 also makes use of the phase/frequency detector reset pulse PDRESET 350, which resets latches of counters within the clock presence circuit when both clocks are determined to be present.

Figure 5:
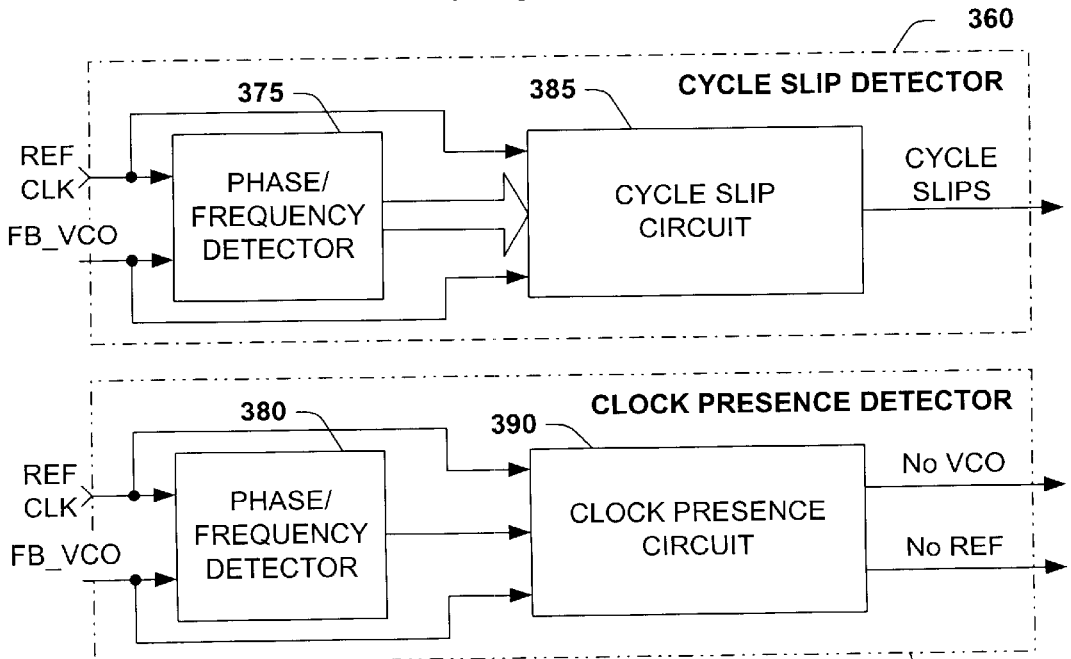
FIG. 5 is a simplified block diagram of an exemplary cycle slip detector of a lock detector, comprising a phase/frequency detector and a cycle slip circuit; and an exemplary clock presence detector of a lock detector, comprising a phase/frequency detector and a clock presence circuit in which various aspects of the present invention may be carried out.

FIG. 5 illustrates a simplified block diagram of another implementation of the exemplary lock detector 300 of FIG. 4, comprising a cycle slip detector 360 and a clock presence detector 370, wherein each of the detectors has a separate phase/frequency detector 375 and 380. The cycle slip detector 360 is comprised of the phase/frequency detector 375 and a cycle slip circuit 385. The clock presence detector 370 is comprised of the phase/frequency detector 380 and a clock presence circuit 390. Again however, by contrast, the lock detector 300 of FIG. 4 has the advantage of a common phase/frequency detector 330, permitting a lower component count.

Figure 6:
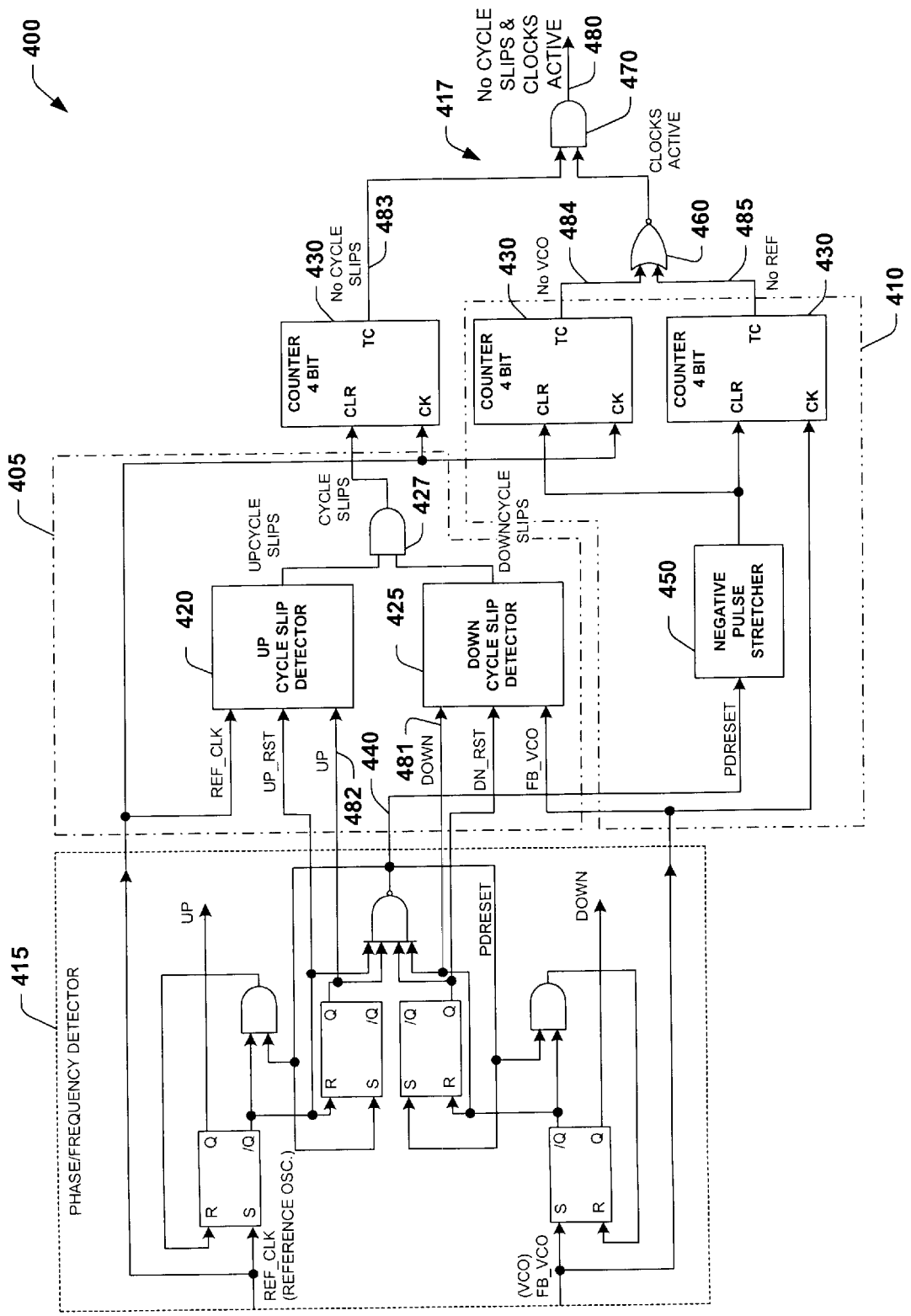
FIG. 6 is a block diagram of an exemplary lock detection circuit combining a cycle slip detector and a clock presence detector of a phase locked loop, used to provide phase and frequency locking for synchronization of clock signals used for data transmission and telecommunications applications in which various aspects of the present invention may be carried out.

FIG. 6 is a block diagram of an exemplary lock detection circuit 400 of a phase locked loop, used to provide phase and frequency locking of clock signals used in data transmission and telecommunications applications, according to the present invention. The lock detection circuit 400 comprises a cycle slip circuit 405 a clock presence circuit 410 and a phase/frequency detector 415 similar to 300 of FIG. 4, and an alarm logic circuit 417 similar to 500 of FIG. 7. The cycle slip detector (305 of FIG. 4, or 405 & 415 of FIG. 6) comprises a cycle slip circuit 405 and a phase/frequency detector 415. The clock presence detector (305 of FIG. 4, or 415 & 410 of FIG. 6) comprises clock presence circuit 410 and the phase/frequency detector 415. Again, the alarm logic 417 is optional, but preferred in the present invention to provide an "all clear" alarm indication, or one that indicates there are no cycle slips and the clocks are active (not missing).

The cycle slip circuit 405 comprises an UP cycle slip detector 420 and a DOWN cycle slip detector 425, an AND logic gate 427. According to an aspect of the present invention, it is desirable to detect NO CYCLE SLIPS which occur for a time which exceeds a predetermined count of reference cycles, by the additional use of (e.g., a 4 bit counter) 430.

The clock presence circuit 410 comprises a negative pulse stretcher circuit 450, and two 4 bit counters 430.

The alarm logic 417 comprises a NOR gate 460 for combining the NO VCO and the NO REF clock presence alarm indications into a CLOCKS ACTIVE indication, and an AND gate 470 for combining the CLOCKS ACTIVE alarm with the No CYCLE SLIPS alarm into a single "all clear" alarm indication 480.

Thus, the present invention provides an innovative lock detector of a phase locked loop used in a communications device. The lock detector uses a cycle slip detector with a clock presence detector to permit a large variation of the clock phase or frequency and adequate time for the PLL to react to the disturbance without causing false alarms. In this way, an alarm is provided to PLL behavior consistent with a significant deviation from the lock condition, in a small low power and low noise digital solution.

Figure 7:
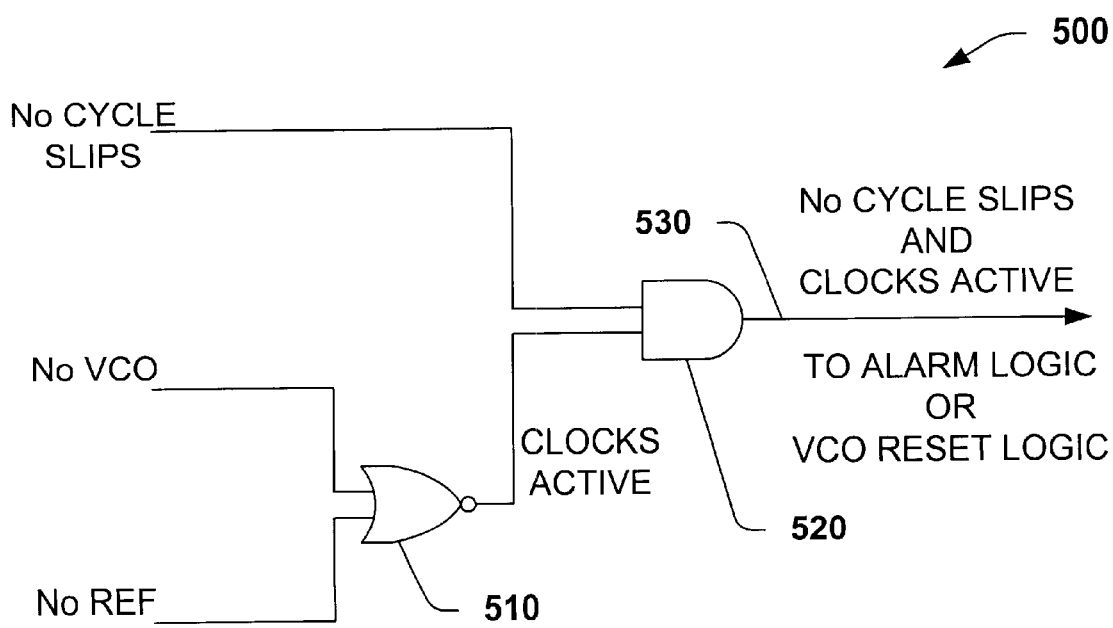
FIG. 7 is a schematic diagram of an exemplary logic circuit for combining the alarm indications from the cycle slip detector and the clock presence detector according to the present invention.

FIG. 7 is a schematic diagram of an exemplary logic circuit 500 for combining the alarm indications from the cycle slip detector and the clock presence detector according to the present invention. The lock detector 400 of FIG. 6 provides 3 alarm indications: No CYCLE SLIPS 483, which is an output indication that a cycle slip has not occurred, and the clock presence outputs (No VCO 484, and No REF 485) which indicate that an input clock is missing.

Although these outputs may be processed separately, or taken in any combination found useful, when these exemplary alarm indications are logically combined as illustrated by the logic circuit 500 schematic, the result of NOR'ing 510 together the No VCO and the No REF clocks yields a CLOCKS ACTIVE output indication, and subsequently AND'ing 520 together this result with the No CYCLE SLIPS output indication, yields a No CYCLE SLIPS and CLOCKS ACTIVE 530 alarm indication.

Figure 8:
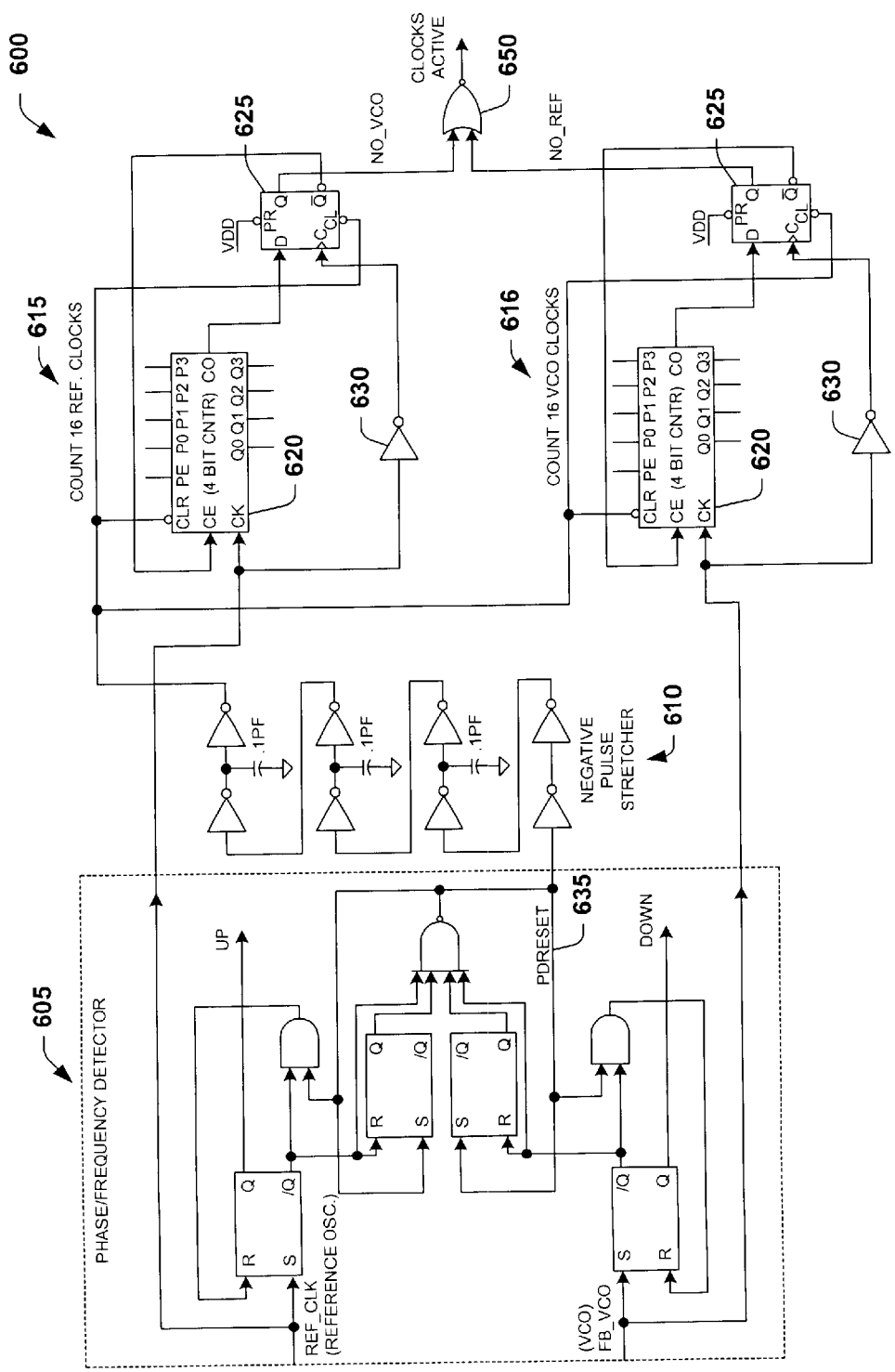
FIG. 8 is a block diagram of an exemplary clock presence detector in which various aspects of the present invention may be carried out.

FIG. 8 illustrates a more detailed functional block diagram of an exemplary clock presence detector 600, in which various aspects of the present invention may be carried out.

The clock presence detector 600, comprises a phase/frequency detector 605, a negative pulse stretching circuit 610, and two 4 bit counters circuits 615 and 616, each comprising a 4 bit counter 620, an output D-FF latch 625, and a clock inverter 630. The reference oscillator clock (REF_CLK) and the divided down VCO clock (FB_VCO) are assumed to be the same frequency when the PLL is locked.

The clock presence detector 600 takes advantage of the "pdreset" signal 635 in the phase/frequency detector 605. The "pdreset" signal 635 resets the latches 625 with a negative going pulse when both clocks are present. With one of the clocks missing the reset signal 635 remains high. Consequently, the counters 620 are used to count 16 clocks and then generate a terminal count that is latched in the output flip flop 625 and disables the counter 620. If 16 reference clocks are counted, the divided down VCO clock (FB VCO) is missing. If 16 divided down VCO clocks (FB VCO) are counted, the reference oscillator clock (REF_CLK) is missing. If both clocks are missing, the result is unknown.

The maximum operating frequency at the phase detector inputs is limited by the counters 620 and is estimated to be 250 MHz for one manufacturing process. Dividing both inputs to the phase detector and counter circuitry extends operation to higher frequencies. A pulse stretching circuit 610 is necessary to make sure the PDRESET signal meets the process dependant minimum pulse width logic requirements for the D-type flip flop 625.

The optional alarm logic NOR gate 650 combines the NO VCO and the NO REF clock presence alarm indications into a CLOCKS ACTIVE indication.

Figure 9:
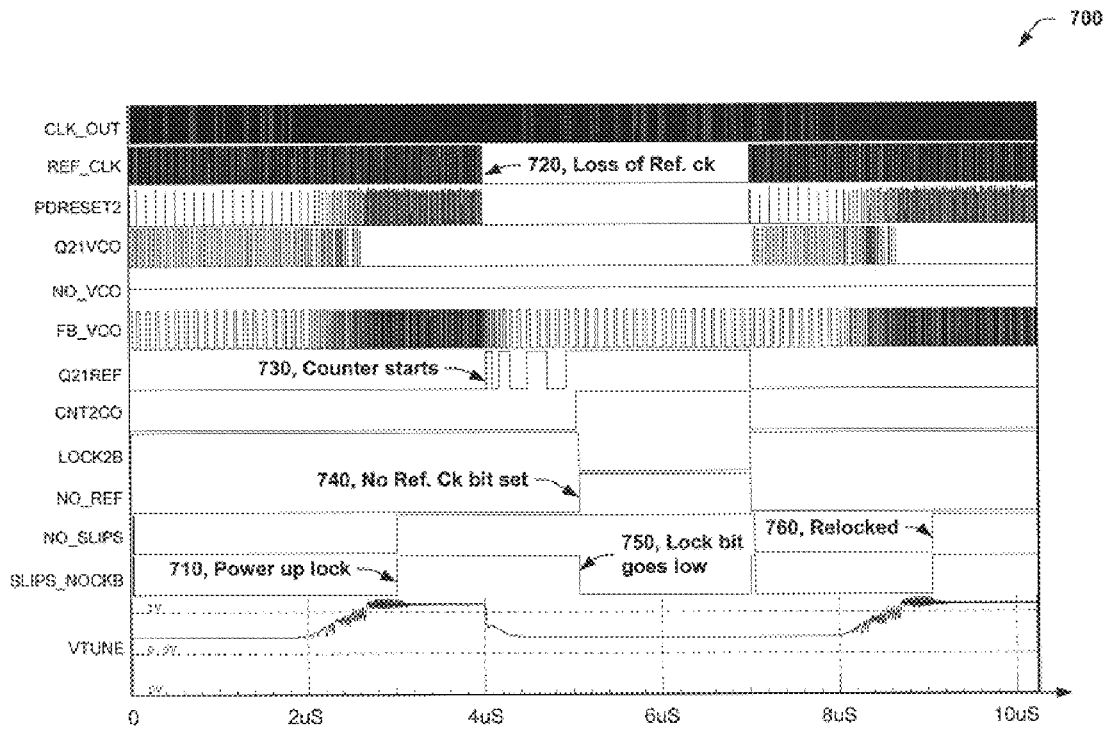
FIG. 9 is a timing diagram of an exemplary clock presence detection circuit (e.g., 600 of FIG. 8) with the cycle slip detector, illustrating the performance in a PLL, with the absence of the reference clock, according to an aspect of the present invention.

FIG. 9 is a timing diagram 700 of an exemplary clock presence detection circuit (e.g., 600 of FIG. 8) with the cycle slip detector, illustrating the performance in a PLL, with the absence of the reference clock, according to an aspect of the present invention. The input frequency to the PLL is 80 MHz and the output frequency is 960 MHz. At power up the VCO tune voltage is clamped so that the VCO output does not stop. At t=3 us (710), power up lock is achieved. At t=4 us the reference clock is disconnected 720 for 3 us, and the counter in the presence detection circuit begins to count 730 and after 15 counts of the divided down VCO (FB_VCO) the no reference clock bit set 740 and the lock detect bit goes low 750. At t=7 us the reference clock is reconnected and by t=9 us (760) the loop relocks and the lock detect goes high again.

Figure 10:
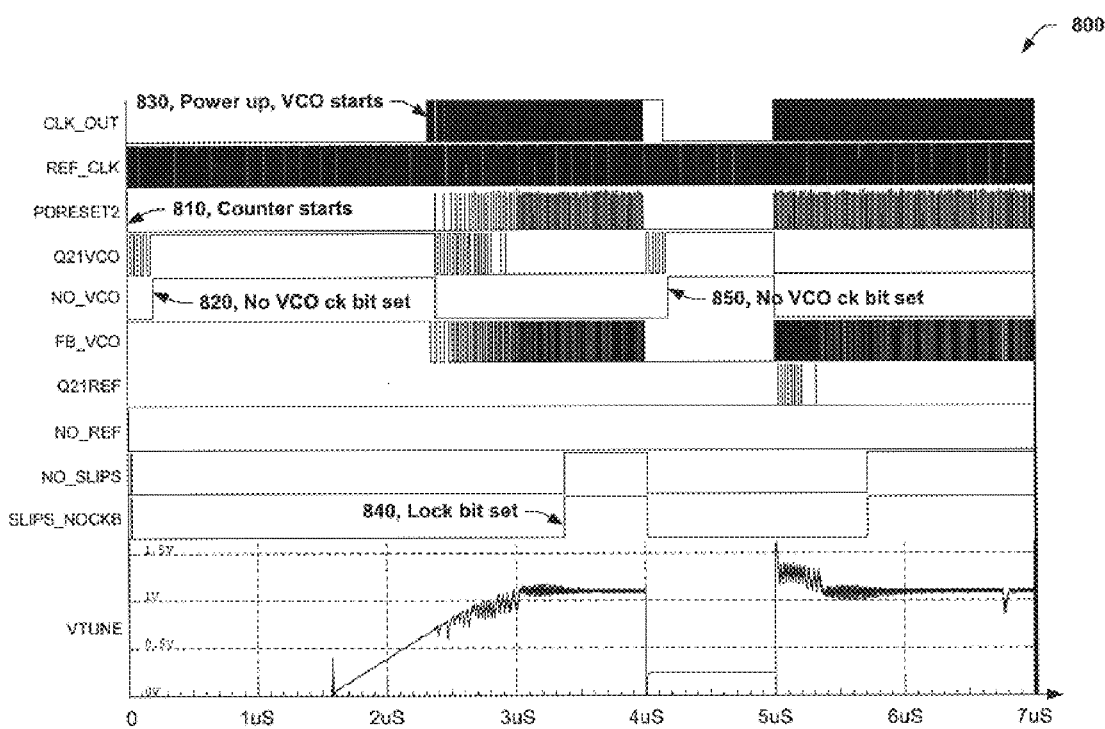
FIG. 10 is a timing diagram of an exemplary clock presence detection circuit (e.g., 600 of FIG. 8) with the cycle slip detector, illustrating the performance in a PLL, with the absence of the feedback VCO clock, according to an aspect of the present invention.

FIG. 10 is a timing diagram 800 of an exemplary clock presence detection circuit (e.g., 600 of FIG. 8) with the cycle slip detector, illustrating the performance in a PLL, with the absence of the feedback VCO clock, according to an aspect of the present invention.

FIG. 10 also shows the power up condition and under normal phase locked conditions. The input reference frequency is 80 MHz and the output frequency is 960 MHz. At t=0 us (810) a tune voltage clamp is removed to allow the VCO clock to stop. The VCO presence detection circuit sets the "no VCO clock" bit at t=0.2 us (820) and clears the bit at t=2.3 us (830) when the VCO restarts. At t=3.5 us (840) the loop locks from the initial power up condition and the lock detection bit is set. At t=4 us the reference clock is switched to a low frequency so that the VCO output quits. The VCO presence detection circuit sets the "no VCO clock" bit at t=4.2 us (850). At t=5 us the reference clock is switched back to 80 MHz causing the "no VCO clock" bit to be cleared when the VCO restarts. These two simulations show the robustness of the clock presence detector and its uses when it is combined with a cycle slip detector.

Figure 11:
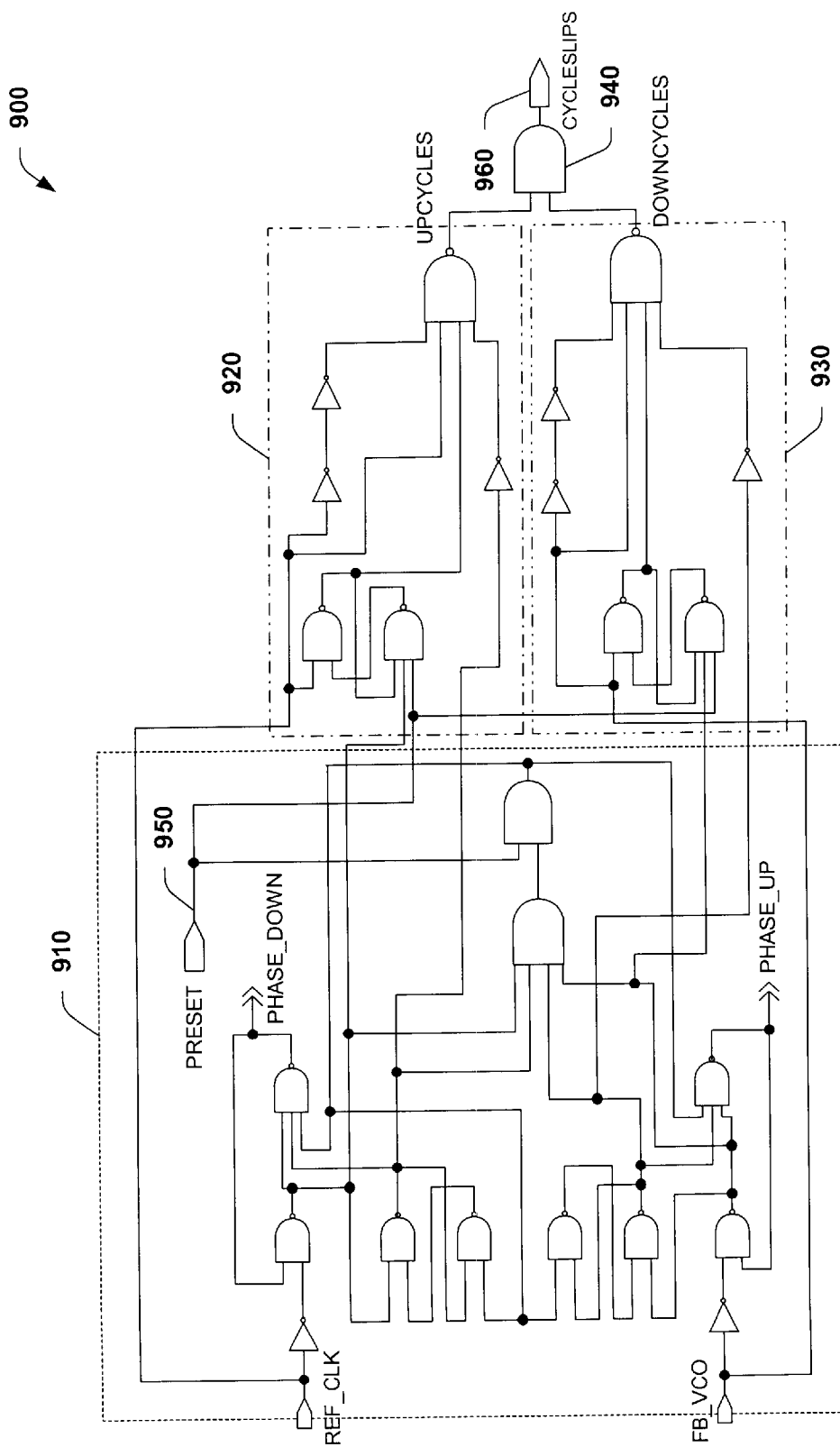
FIG. 11 is a schematic diagram illustrating an exemplary cycle slip detector in accordance with an aspect of the present invention.

FIG. 11 is a more detailed schematic diagram illustrating an exemplary cycle slip detector 900 in accordance with an aspect of the present invention, and as illustrated in FIG. 6.

The cycle slip detector 900 of FIG. 11, detects frequency differences between its two input clocks REF_CLK and FB_VCO, that remain different for a time period greater than the inverse of the frequency difference (one clock period of this frequency difference). The cycle slip detector 900 generates a pulse when the phase/frequency detector 910 output pulse width rolls over from its largest pulse width to its narrowest pulse width. The cycle slip detector circuit 900 consists of a phase/frequency detector 910, an UP cycle slip detector 920, a DOWN cycle slip detector 930, and a final AND gate 940. The inputs to the circuit are the reference clock REF_CLK, and the feedback of the divided down VCO clock FB_VCO from the PLL divide by M divider.

The outputs of the phase/frequency detector 910 are UP pulses and DOWN pulses. The outputs of the cycle slip detector are active low UP cycle slips UPCYCLES and DOWN cycle slips DOWNCYCLES. A logical AND 940, of the active low UP cycle slips UPCYCLES and DOWN cycle slips DOWNCYCLES produces an active low cycle slip detector output CYCLESLIPS. This output is used to reset a counter and count reference clocks between cycle slips.

Figures 12, 13:
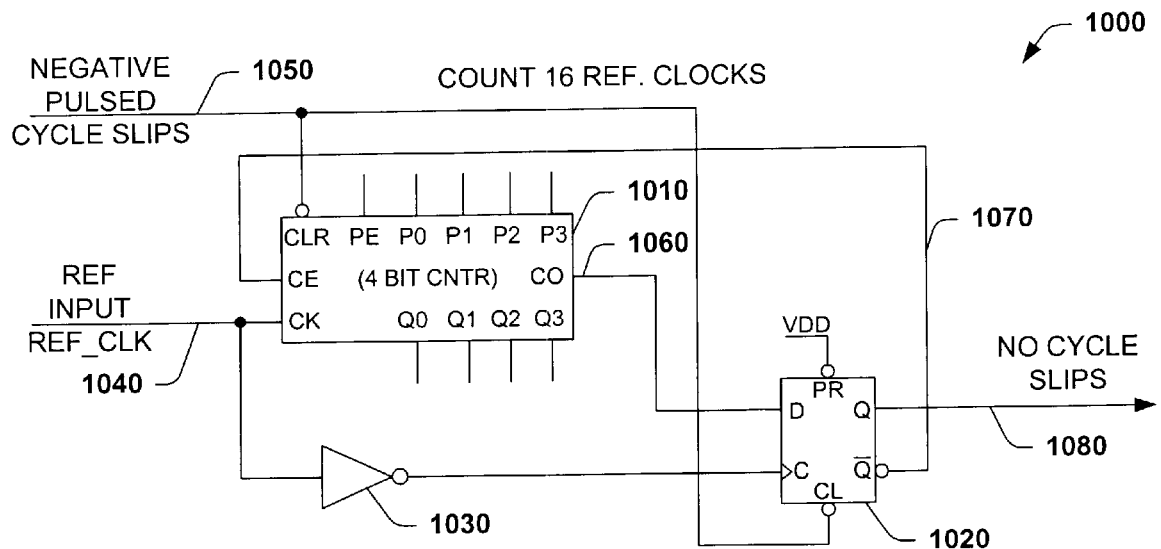
FIG. 12 is a simplified schematic diagram which illustrates a 4 bit counter circuit as used in the cycle slip circuit and the clock presence circuit, in accordance with an aspect of the invention.
FIG. 13 is a truth table for the cycle slip detector, which illustrates the reference clock and feedback VCO clock input states/conditions and the resultant outputs produced.

FIG. 12 gives an exemplary counter circuit 1000 for counting reference clocks after a cycle slip as used in the cycle slip circuit and the clock presence circuit, in accordance with an aspect of the invention. The counter circuit 1000 of FIG. 12 comprises, a 4 bit counter 1010, a D-FF latch 1020, and a clock feedback inverter 1030.

For example, if 16 reference clocks REF_CLK 1040 are counted after a cycle slip 1050, then the loop is set to the locked state by latching the carry out 1060 of the counter 1010 and disabling via 1070 any further counts. If before the counter 1010 reaches its maximum count, another negative pulsed CYCLE SLIPS 1050 is detected, then the counter 1010 and latch 1020 is cleared, and a CYCLE SLIPS indication 1080 is output.

The cycle slip detector does not detect loss of reference clock or loss of VCO feedback clock. The cycle slip detector requires both input clock signals to be present. With one clock missing, the output of the cycle slip detector stays a constant high, which indicates a locked condition to the following circuitry.

FIG. 13 is a truth table for the cycle slip detector 900 of FIG. 11 according to an aspect of the invention, which illustrates the reference clock REF_CLK and feedback VCO clock FB_VCO input states/conditions and the resultant outputs CYCLESLIPS produced from AND gate 940 of FIG. 11 (or e.g., 427 of FIG. 6). A "1" indicates the signal is stuck at a high state, a "0" indicates that the signal is absent or stuck at a low state, "T" indicates that the signal is toggling normally, and an "H" indicates that a high state is output.

Figure 14:
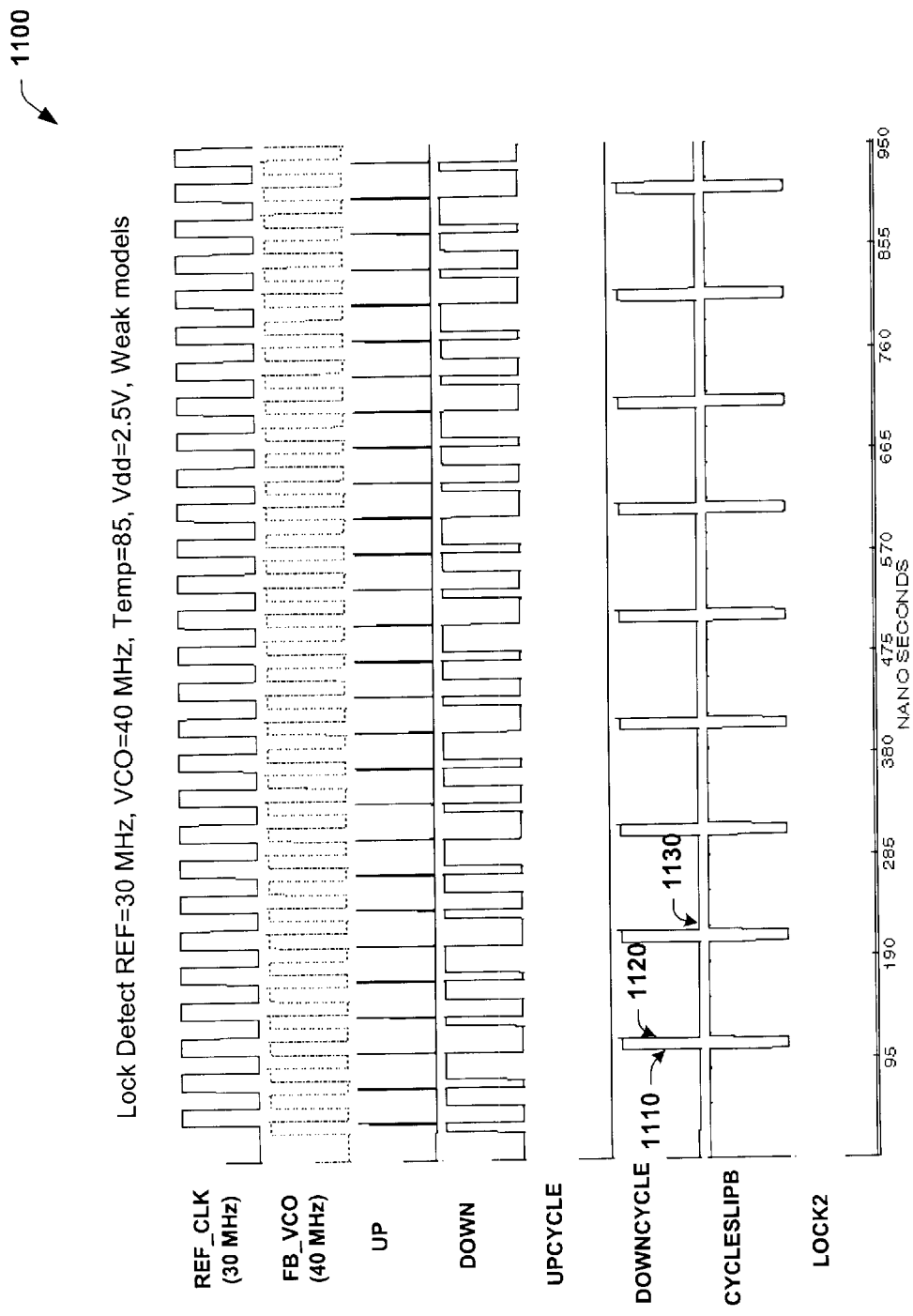
FIG. 14 is a timing diagram illustrating the operation of an exemplary cycle slip detector having a reference frequency which is less than the feedback VCO frequency in association with an aspect of the present invention, and demonstrating a down cycle slip condition.
Figure 15:
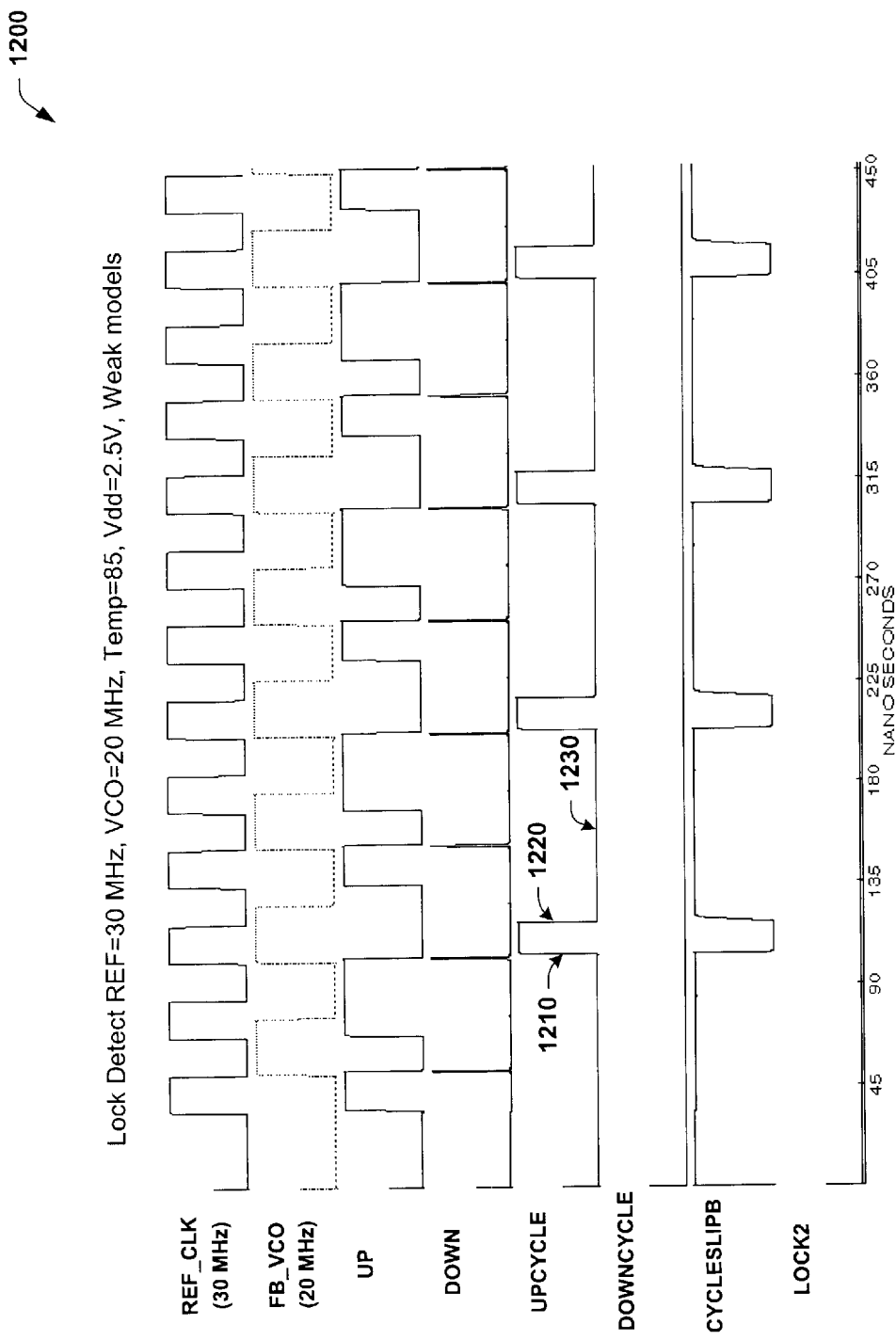
FIG. 15 is a timing diagram illustrating the operation of an exemplary cycle slip detector having a reference frequency which is greater than the feedback VCO frequency in association with an aspect of the present invention, and demonstrating an up cycle slip condition.
Figure 16:
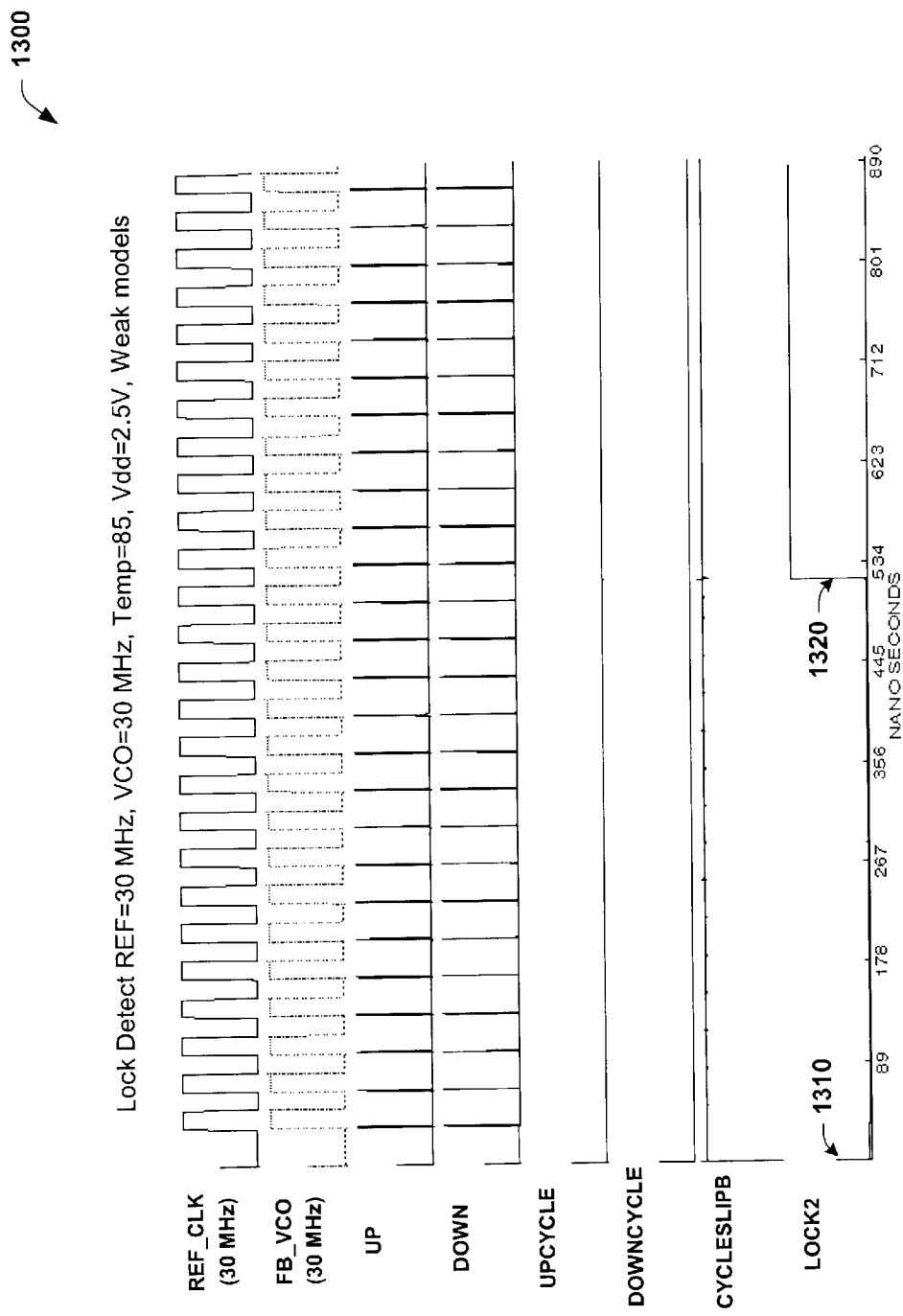
FIG. 16 is a timing diagram illustrating the operation of an exemplary cycle slip detector having a reference frequency which is equal to the feedback VCO frequency in association with an aspect of the present invention, and demonstrating a no cycle slips condition.

The results at the bottom of the table of FIG. 13 also illustrate three relative frequency comparisons between the reference clock and the feedback VCO clock. These three relative frequency comparisons will be demonstrated in the cycle slip detector results illustrated in FIGS. 14, 15, and 16 as follows:

| FIG. 14: | $f_{REF} < f_{vco}$ | (ie. 30 MHz < 40 MHZ) | (DOWN cycle slip) |
|---|---|---|---|
| FIG. 15: | $f_{REF} > f_{vco}$ | (ie. 30 MHz > 20 MHz) | (UP cycle slip) |
| FIG. 16: | $f_{REF} = f_{vco}$ | (ie. 30 MHz = 30 MHz) | (NO cycle slips, NO response) |

FIG. 14 is a timing diagram 1100 illustrating the operation of an exemplary cycle slip detector (e.g., 900 of FIG. 11) having a reference frequency (30 MHz) which is less than the feedback VCO frequency (40 MHz) in association with an aspect of the present invention, and demonstrating a down cycle slip condition.

FIG. 14 shows that the DOWN output (e.g., 481 of FIG. 6) of the phase/frequency detector (e.g., 415 of FIG. 6) is a pulse width modulated signal, while the UP output (e.g., 482 of FIG. 6) of the phase/frequency detector has constant narrow UP pulses, which indicates no response.

FIG. 14 also shows a 10 MHz difference between the 30 MHz reference frequency REF_CLK and 40 MHz VCO frequency FB_CLK, which causes a 10 MHz beat note in the pulse width modulation output of the phase/frequency detector. Using the rising edge of VCO as a sample clock to the Reference waveform outlines a 10 MHz period beat note. Using the rising edge to rising edge of the VCO waveform as a cycle bin and reflecting these bins on the pulse width modulated waveform output (DOWN) of the phase/frequency shows a cycle bin where no edges occur. This is a cycle slip DOWN. Sampling this non response latches the cycle slip and causes one pulse per beat note.

This frequency difference produces a beat note pulse therefore, which begins with the rising edge 1110 of REF_CLK and ends with the falling edge 1120 of FB_VCO to an active low state 1130.

Reversing the inputs (VCO frequency less than the reference frequency) causes pulse width modulation on the UP signal and constant negative pulses on the DOWN signal. FIG. 15 shows the time response of the cycle slip detector (e.g., 900 of FIG. 11) for a 30 MHz reference frequency and 20 MHz VCO frequency. A cycle bin where no edges occur causes a cycle slip UP to occur. This frequency difference produces a beat note pulse therefore, which begins with the rising edge 1210 of FB_VCO and ends with the falling edge 1220 of REF_CLK to an active low state 1230.

FIG. 16 shows the time response of the detector with equal VCO and Reference input frequency. The UP and Down signals produce no cycle slip response. The bottom LOCK2 waveform shows the response of a simple 4 bit counter to generate a lock detect signal. After 16 reference periods (e.g., 1040 of FIG. 12) the carry out (e.g., 1060 of FIG. 12) of the counter (e.g., 1010 of FIG. 12) goes high and the counter is disabled until the next cycle slip (e.g., 1050 of FIG. 12) occurs.

A low on the preset (e.g., 950 of FIG. 11) of the slip detector (e.g., 900 of FIG. 11) initializes the CYCLESLIPS output (e.g., 960 of FIG. 11) to the No SLIP condition. A high on the preset allows normal operation. This preset signal can be used in simulations to clear out unknown states from the RS latch.

The active low pulse width from an up cycle slip consists of the rising edge of the divided down VCO and the falling edge of the reference clock. The active low pulse width from a down cycle slip consists of the rising edge of the reference clock and the falling edge of the VCO clock. Consequently, a narrow pulse width divided down VCO with a 50% duty cycle reference clock will produce a narrow cycle slip detector output only for the down cycle case where the VCO frequency is greater than the output frequency.

The maximum input frequency for a specific SPICE simulation model, was 500 MHz until cycle slips were lost.

According to one aspect of the present invention, the same phase/frequency detector may be used in the cycle slip detector, the clock presence detector, as well as the PLL, thus providing a commonality of circuitry, a minimizing the amount of hardware, and the number of spurious signals. In addition, an extra third clock is unnecessary, thereby minimizing noise coupling to the PLL loop.

By contrast to the conventional lock detector circuits, the present invention illustrated in FIG. 6 provides the benefit of an all digital solution with an inherent higher noise immunity. One reason for the high noise immunity is that the cycle slip pulse can only be corrupted within a narrow time window when the phase wraps from the widest pulse width to the narrowest pulse width. This mechanism is similar to a master slave flip flop and has high noise immunity.

Another advantage of the present invention is that the cycle slip detector allows 360 degrees of phase shift before detecting a cycle slip, which allows enough time for the PLL to react to disturbances without causing a false alarm.

Even though digital circuitry has been used as a solution for the lock detector which combines a cycle slip detector and a clock presence detector in this example, it will be apparent to anyone skilled in the art, that firmware or a high speed software program, may also be used to provide the same function.

In another variation of the present invention, one or more of the three alarm outputs (e.g., 320, 322, and 324 of FIG. 4) of the lock detection circuit (e.g., 300 of FIG. 4) may be combined to yield a specific alarm condition, or used separately to provide an applicable PLL output indication. In addition to the initial cycle slip indication from the CYCLESLIPS output (e.g., 320 of FIG. 4, or 960 of FIG. 11), an output indication of a cycle slip condition which has persisted for a predetermined time measured in reference cycle counts (e.g., 16 counts), is available from the No CYCLE SLIPS output at 483 of FIG. 6.

A lock detection circuit combines a cycle slip detector with clock presence detection in a phase lock loop used to provide phase and frequency locking for synchronization of clock signals used for data transmission and telecommunications applications, permitting a large variation of the clock phase or frequency and adequate time for the PLL to react to the disturbance without causing false alarms. In this way, an alarm is provided to PLL behavior consistent with a significant deviation from the lock condition, in a small low power and low noise digital solution. The circuit provides a very significant improvement in phase and frequency locking capability, while avoiding major disruptions in the operation of the system from an unnecessary reset.

Additionally, the circuit provides several areas of circuit commonality or duplication to simplify the circuit, provide for circuit modularity, and keep component quantities low. The methodology and architecture used to achieve these goals provide a significant improvement in performance over prior art.

Conventional solutions for the loss of a clock signal would require a significantly larger number of counters for the same accuracy and in addition, need a third reference clock. Adding a third reference clock could inject a signal to the PLL and cause jitter at the output. Quadrature phase detection, time window edge comparison, tune voltage window comparison, and frequency discrimination are the most common methods of conventional lock detection. Of these, quadrature phase detection, tune voltage window comparison, and frequency discrimination require a significant amount of analog circuitry which would require more chip area and power than the digital solution presented. The tune voltage window comparison detector may generate a number of false alarms because of variations in the phase error of the PLL as the loop corrects for various disturbances.

Thus the innovative lock detector of a phase locked loop permits a large variation of the clock phase or frequency and adequate time for the PLL to react to the disturbance without causing false alarms, while providing an alarm to PLL behavior consistent with a significant deviation from the lock condition, in a small low power and low noise digital solution.

Figure 17:
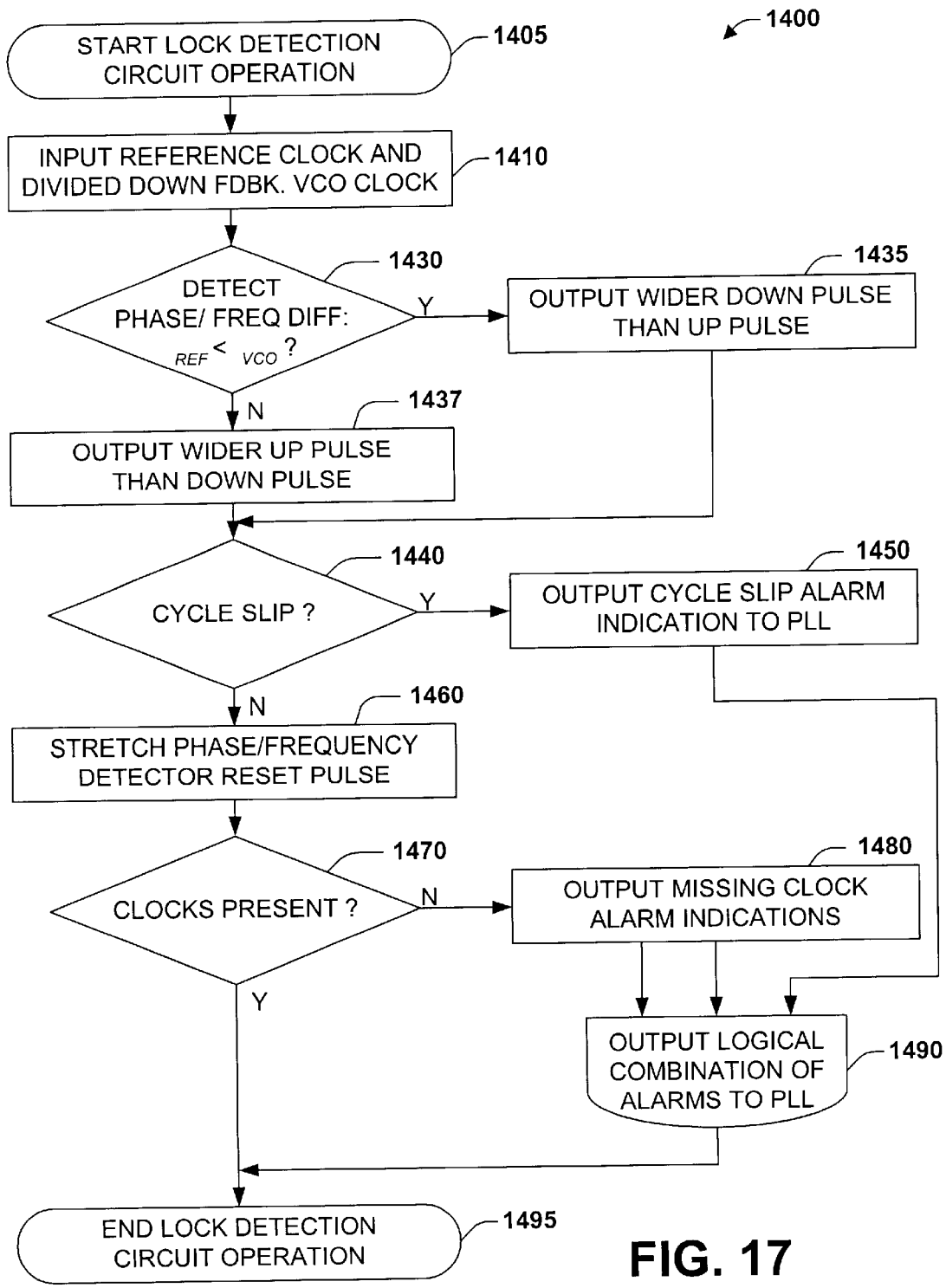
FIG. 17 is a flow diagram illustrating an exemplary method for lock detection circuit operation in association with an aspect of the present invention.

Another aspect of the present invention provides a methodology for lock detection circuit operation of precise phase and frequency locking and synchronization of clock signals of a phase locked loop in data transmission and telecommunications applications and the manufacture of such devices illustrated and described herein, as well as with other such devices. Referring now to FIG. 17, an exemplary method 1400 is illustrated for lock detection circuit operation in association with an aspect of the present invention. While the exemplary method 1400 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 1400 may be implemented in association with the apparatus and systems illustrated and described herein as well as in association with other systems not illustrated.

The method 1400 comprises detection of a lock condition in a phase lock loop, wherein the lock detection circuit combines a cycle slip detection with clock presence detection in a phase lock loop used to provide phase and frequency locking for synchronization of clock signals used for data transmission and telecommunications applications, permitting a large variation of the clock phase or frequency and adequate time for the PLL to react to the disturbance without causing false alarms.

Reference and VCO feedback clocks are input into a phase/frequency detector circuit which detects the frequency difference between the clocks. Pulse width modulated UP and DOWN clock phase pulses are generated by the PFD and fed into UP and DOWN cycle slip detectors which detect if a cycle slip has occurred by determining if the phase difference has remained for a length of time which exceeds the period of the beat frequency of either of the cycle slip detectors, whereby a cycle slip is indicated and may be output as an alarm indication. If, for example, a cycle slip is indicated, a counter (e.g., a 4 bit counter), also begins counting up to reference clock counts to determine if the cycle slip remains in the slip condition for longer than the 16 reference counts, which then indicates a "No CYCLES SLIP (NOT)" alarm condition. If the cycle slip does not remain for the 16 reference counts, the counter is cleared until the next cycle slip is indicated. The reference and feedback VCO clocks are also fed to a clock presence detector along with and a reset from the PFD. Before entering the clock presence detector, the PFD reset pulse passes thru a pulse stretcher which widens the pulse for reliable operation of the counter. The clock presence circuit determines whether either of the reference or the feedback VCO clocks are missing, and if so, checks that the clock is missing for a count of, for example, 16 counts of a 4 bit counter. If the maximum count is reached while either clock is missing, a corresponding missing clock alarm indication is output("NO_VCO", or "NO_REF CLOCK"). Optionally, some or all of the cycle slip and missing clock alarms may be logically combined and used as an alarm indication of the lock condition to the PLL. Thereby, permitting a large variation of the clock phase or frequency and adequate time for the PLL to react to the disturbance without causing false alarms.

The lock detection circuit operation method begins at 1405. At 1410 a reference clock and a divided down VCO feedback clock is input to a phase/frequency detector circuit. At 1430 the (e.g., same PFD, or another) phase/frequency detector determines the frequency difference between the reference and the VCO feedback clock, wherein the difference results in widening of the DOWN pulse at 1435, if the frequency of the is greater than that of the VCO feedback clock. Otherwise, if the frequency of the reference clock is not greater than that of the VCO feedback clock, the UP pulse width is widened at 1437, thereby, providing pulse width modulated UP and DOWN signals proportional to the phase difference between the input signals.

The cycle slip detector determines from the pulse width modulated UP and DOWN signals, along with the reference and feedback VCO clocks if a cycle slip has occurred at 1440. If a cycle slip was detected, a "CYCLE SLIP" alarm indication is output at 1450 to the PLL. Otherwise, the operation continues to 1470 where a determination is made as to the presence of the reference and the feedback VCO clocks. If it is determined that either of the clocks are missing, a corresponding alarm indication is output at 1480. Optionally, the missing clock indications from 1480, together with the cycle slip indication from 1450 is logically combined as an alarm or a lock indication and output to the PLL at 1490.

Thereafter at 1495, the lock detection operation ends, wherein a lock detection circuit combines cycle slip detection with clock presence detection in a phase lock loop used to provide phase and frequency locking for synchronization of clock signals used for data transmission and telecommunications applications, permitting a large variation of the clock phase or frequency and adequate time for the PLL to react to the disturbance without causing false alarms.

Alternately, at 1495, a determination may also be made whether the high lock detection circuit operation is still enabled. If the operation is still enabled, the lock detection circuit operation continues at 1410, otherwise the operation thereafter ends at 1495, and the method 1400 may be repeated for subsequent lock detection circuit operations of a communications device.

Figure 18:
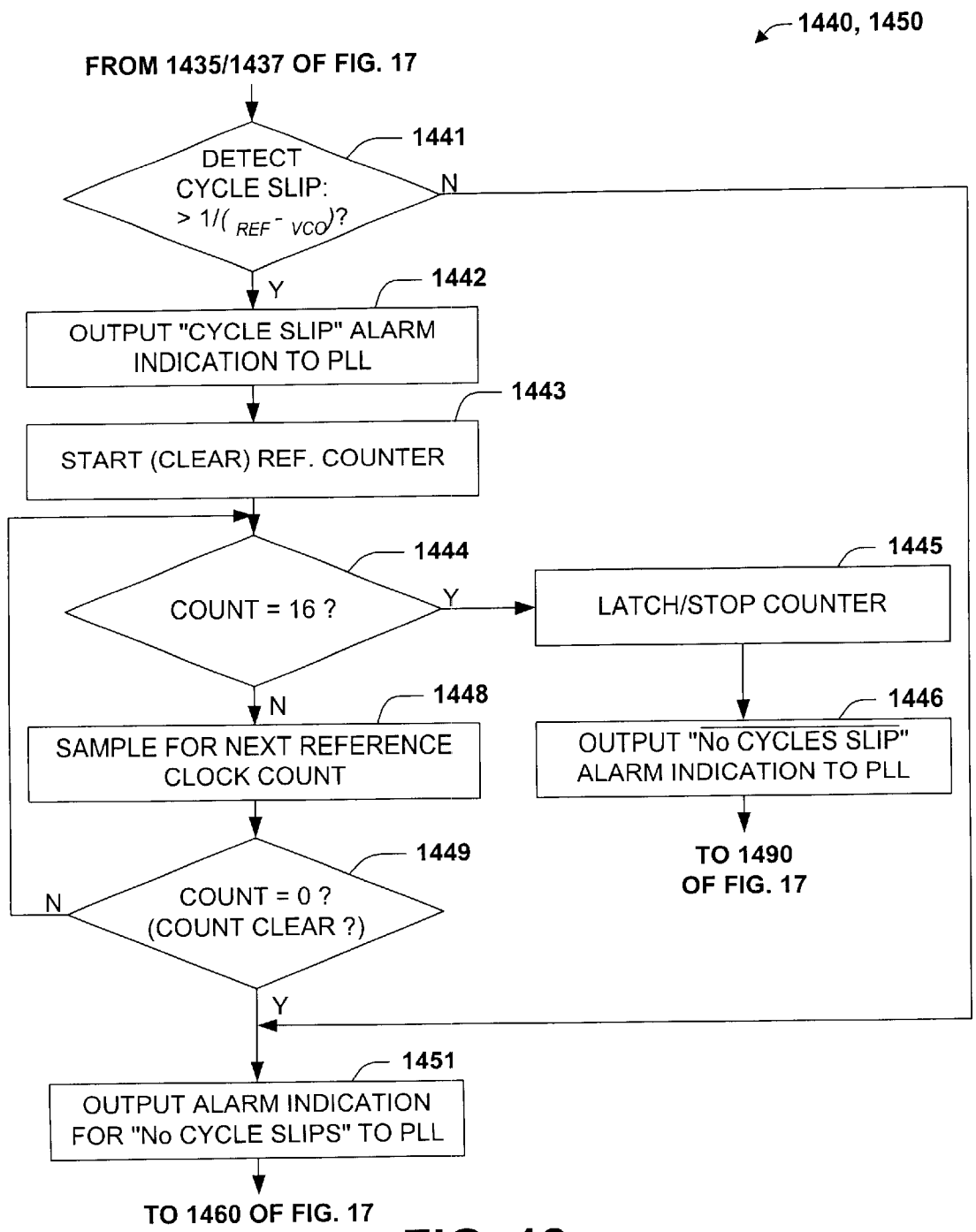
FIG. 18 is a flow diagram illustrating an exemplary method for the cycle slip detection and alarm indication operations 1440 and 1450 of FIG. 17 for the lock detection circuit operation in association with an aspect of the present invention.

FIG. 18 is a flow diagram illustrating an exemplary method for the cycle slip determination and alarm indication output operations 1440 and 1450 of the method 1400 of FIG. 17 for the lock detection circuit operation in association with an aspect of the present invention. The cycle slip determination and alarm indication output operations 1440 and 1450, hereinafter begins at 1441.

The pulse width modulated UP and DOWN clock phase pulses which were generated by the PFD, are fed into UP and DOWN cycle slip detectors which detect if a cycle slip has occurred by determining at 1441, if the current time duration (t) of the phase difference is greater than the period $(1/(f_{REF} - f_{vco}))$ of the beat frequency of either of the cycle slip detectors, whereby a cycle slip is indicated and may be output as an alarm indication. If the current time duration (t) of the phase difference is greater than the period $(1/(f_{REF} - f_{vco}))$ of the beat frequency of either of the cycle slip detectors, a cycle slip is detected, and an alarm indication is output to the PLL at 1442.

At 1437 a counter (e.g., a 4 bit counter) is cleared by the cycle slip detection and begins counting reference clock counts while the cycle slip remains. The counter is polled at 1444 to determine if the cycle slip condition has remained for longer than the maximum count of 16 reference counts. If the maximum count of 16 reference clocks is achieved, indicating that a corresponding predetermined time has been exceeded during which the cycle slip condition has remained, the counter is latched stopping the counter at 1445, a "No CYCLES SLIP (NOT)" alarm condition is output to the PLL at 1446, and the operation continues back to 1490 of FIG. 17. If, however at 1444, the cycle slip condition does not remain for the 16 reference clock counts, the reference clock is again sampled at 1448 waiting for further counts.

The counter is again polled at 1449 to determine if the counter has been cleared by a new cycle slip condition pulse, while waiting for another reference clock count. If the counter has not been cleared at 1449, then the reference clock count continues at 1444. Otherwise, the counter is determined to be cleared until the next cycle slip is indicated, and a NO CYCLE SLIPS indication is output to the PLL at 1451, and the cycle slip determination and alarm indication output operations 1440 and 1450 of the method 1400 ends and the lock detection operation continues back to 1460 of FIG. 17.

Figure 19:
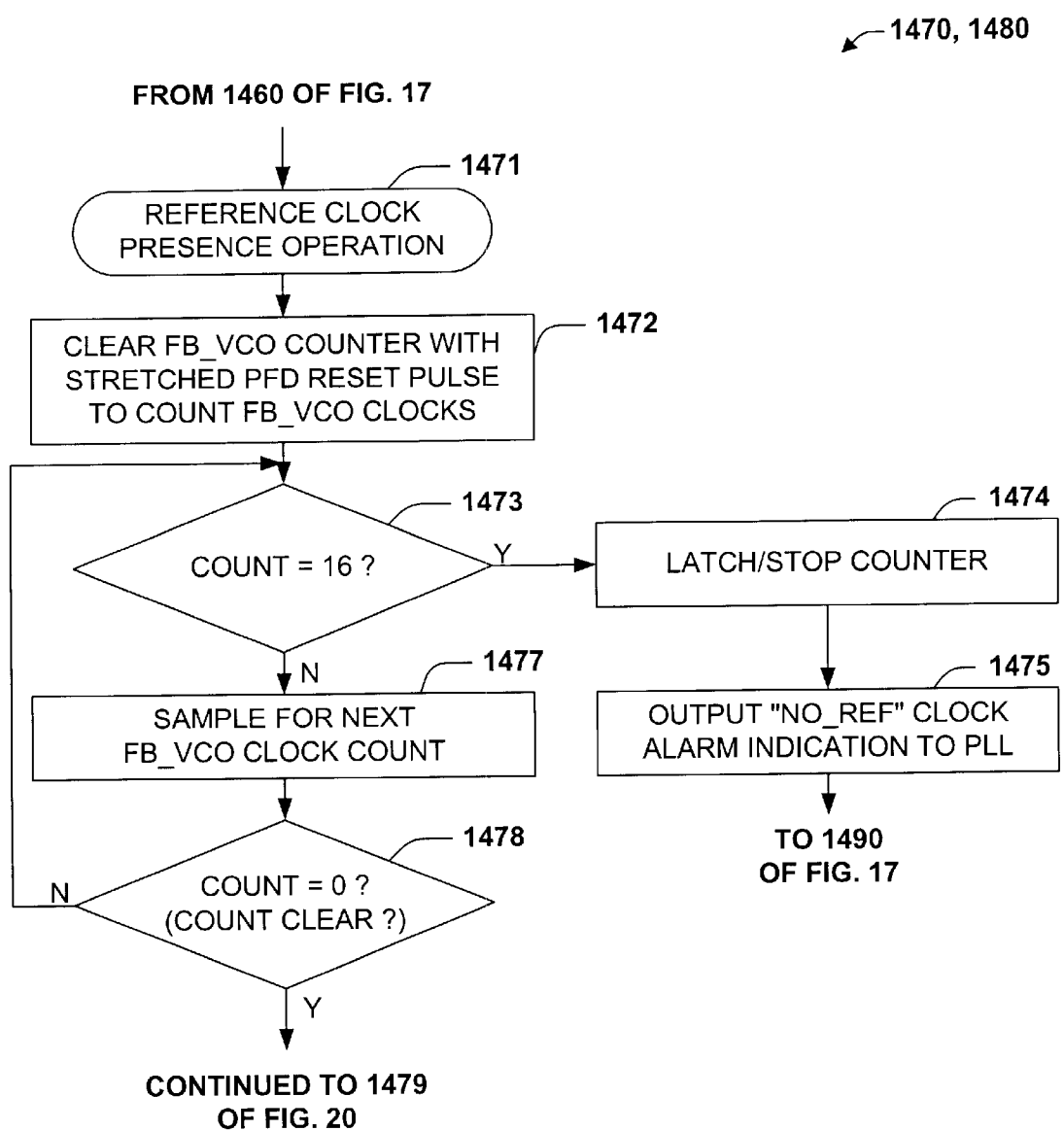
FIG. 19 is a flow diagram illustrating an exemplary method for the reference clock presence detection and alarm indication operations 1470 and 1480 of FIG. 17 for the lock detection circuit operation in association with an aspect of the present invention.
Figure 20:
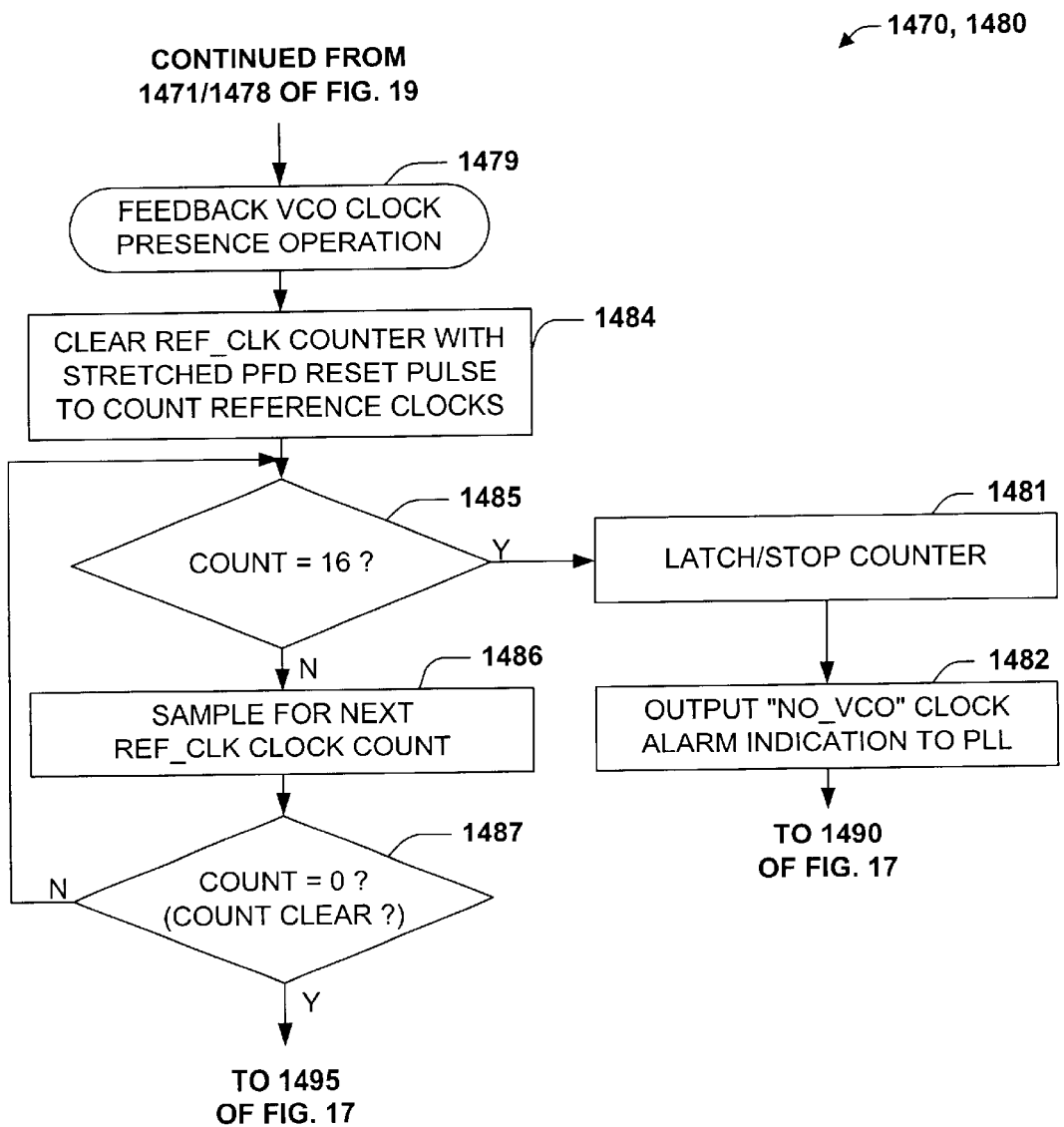
FIG. 20 is a flow diagram illustrating an exemplary method for the feedback VCO clock presence detection and alarm indication operations 1470 and 1480 of FIG. 17 for the lock detection circuit operation in association with an aspect of the present invention.

FIGS. 19 and 20 illustrate a two-part flow diagram of an exemplary method for the clock presence determination and missing clock alarm indications output operations 1470 and 1480 of the method 1400 of FIG. 17 for the lock detection circuit operation in association with an aspect of the present invention. The clock presence determination and alarm indications output operations 1470 and 1480, hereinafter begins at 1471.

The stretched PFD reset pulse from 1460 of FIG. 17, along with the reference and the feedback VCO clocks, are input to two counters (e.g., 4 bit counters) which act as clock presence detectors to determine if a clock is missing for a predetermined time by counting the other of the remaining clocks.

The reference clock presence circuit operation method begins at 1471 of FIG. 19. At 1472 the stretched PFD reset pulse is input to the CLR terminal of the FB_VCO counter (e.g., a 4 bit counter) to clear the counter while a reference clock and a divided down VCO feedback clock is present at the inputs to the PFD circuit of the clock presence detector. (When both clock have been present, a reset pulse is output from the PFD circuit.) FB_VCO clocks are input to the clock input of the FB_VCO counter to produce an up-count of the counter.

The FB_VCO counter is polled at 1473 to determine if the maximum count of 16 feedback VCO clocks have been counted without receipt of reference clock count, which would cause the PFD to issue a reset pulse. If the maximum count of 16 feedback VCO clocks is achieved, indicating that a corresponding predetermined time has been exceeded without receipt of reference clock count, the counter is latched stopping the counter at 1474, a "NO_REF" clock alarm condition is output to the PLL at 1475, and the operation continues back to 1490 of FIG. 17. If, however at 1473, the missing reference clock condition does not remain for the 16 feedback VCO clock counts, the feedback VCO clock is again sampled at 1477 waiting for further counts.

The FB_VCO counter is again polled at 1478 to determine if the counter has been cleared by a PFD pulse, while waiting for another FB_VCO clock count. If the counter has not been cleared at 1478, then the FB_VCO clock count continues at 1473. Otherwise, the counter is determined to be cleared, indicating that the reference clock is present, and the reference clock presence circuit and missing clock alarm indication output operations 1470 and 1480 of the method 1400 continues to 1479 of FIG. 20.

The feedback VCO clock presence circuit operation method begins at 1479 of FIG. 20. At 1484 the stretched PFD reset pulse is input to the CLR terminal of the REF_CLK counter (e.g., a 4 bit counter) to clear the counter while a reference clock and a divided down VCO feedback clock is present at the inputs to the PFD circuit of the clock presence detector. (When both clock have been present, a reset pulse is output from the PFD circuit.) REF_CLK clocks are input to the clock input of the REF_CLK counter to produce an up-count of the counter.

The REF_CLK counter is polled at 1485 to determine if the maximum count of 16 reference clocks have been counted without receipt of feedback VCO clock count, which would cause the PFD to issue a reset pulse. If the maximum count of 16 reference clocks is achieved, indicating that a corresponding predetermined time has been exceeded without receipt of feedback VCO clock count, the counter is latched stopping the counter at 1481, a "NO_VCO" clock alarm condition is output to the PLL at 1482, and the operation continues back to 1490 of FIG. 17. If, however at 1485, the missing feedback VCO clock condition does not remain for the 16 reference clock counts, the reference clock is again sampled at 1486 waiting for further counts.

The REF_CLK counter is again polled at 1487 to determine if the counter has been cleared by a PFD pulse, while waiting for another REF_CLK clock count. If the counter has not been cleared at 1487, then the REF_CLK clock count continues at 1485. Otherwise, the counter is determined to be cleared, indicating that the feedback VCO clock is present, and the feedback VCO clock presence circuit and missing clock alarm indication output operations 1470 and 1480 of the method 1400 ends, and the lock detection operation 1400 continues back to 1495 of FIG. 17.

The methodology 1400 thus provides for a lock detection circuit, wherein the lock detection circuit combines a cycle slip detector with clock presence detection in a phase lock loop used to provide phase and frequency locking for synchronization of clock signals used for data transmission and telecommunications applications, permitting a large variation of the clock phase or frequency and adequate time for the PLL to react to the disturbance without causing false alarms. In this way, an alarm is provided to PLL behavior consistent with a significant deviation from the lock condition, in a small low power and low noise digital solution. The circuit provides a very significant improvement in phase and frequency locking capability, while avoiding major disruptions in the operation of the system from an unnecessary reset.

Additionally, the circuit provides several areas of circuit commonality or duplication to simplify the circuit, provide for circuit modularity, and keep component quantities low. The methodology and architecture used to achieve these goals provide a significant improvement in performance over prior art.

Other variants of methodologies may be provided in accordance with the present invention, whereby lock detection circuit operation is accomplished employing a cycle slip detector which detects frequency differences between its two input clocks that remain different for a time period greater than the inverse of the frequency difference, and outputs an alarm indication of the cycle slip after a predetermined time while the alarm condition remains, and employs a clock presence detector which detects a missing reference or feedback VCO clock by counting the other of the remaining clocks for a predetermined time correlated to a predetermined count of the remaining clocks, and is operable to output an alarm indication of a missing clock and a cycle slip condition when a significant deviation from the lock condition occurs, permitting a large variation of the clock phase or frequency and adequate time for the PLL to react to the disturbance without causing false alarms.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A lock detection circuit (300) for a phase locked loop, comprising:

a cycle slip detector (305) operable to receive a reference clock and a VCO feedback clock, and generate a no cycle slips alarm, wherein the cycle slip detector is operable to detect the frequency difference between the reference clock and the VCO feedback clock that remains for a time period greater than the inverse of the frequency difference of the clocks, whereby the lock detection circuit provides an indication of the lock condition as represented by the no cycle slips alarm, which indicates whether a cycle slip has occurred; and a clock presence detector (310) operable to receive the reference clock and the VCO feedback clock, and generate a no VCO alarm and a no REF alarm, wherein the clock presence detector is operable to detect if the reference clock or the VCO feedback clock is missing for a time greater than a predetermined count of either remaining clock, whereby the lock detection circuit provides an indication for the PLL of the presence of the reference clock and the VCO feedback clock, thereby permitting a large variation of the clock phase or frequency and adequate time for the PLL to react to the disturbance without causing false alarms, while providing an alarm to PLL behavior consistent with a significant deviation from the lock condition in a small, low power and low noise digital solution.

2. The system of claim 1, wherein the cycle slip detector (305) of the lock detection circuit (300) comprises;

a phase/frequency detector (330) operable to receive a reference clock and a VCO feedback clock, and generate an up pulses signal, a down pulses signal, a phase detector reset signal, and a pulse reset signal, wherein the phase/frequency detector is operable to detect whether the reference clock, or the VCO feedback clock frequencies are greater, wherein if the frequency of the reference clock is greater than the VCO feedback clock, the phase/frequency detector produces a pulse width modulated up pulses signal output and constant negative pulses on the down pulses signal output, however, if the frequency of the VCO feedback clock is greater than the reference clock, the phase/frequency detector produces a pulse width modulated down pulses signal output and constant positive pulses on the up pulses signal output; and a cycle slip circuit operable to receive the reference clock and the VCO feedback clock, the up pulses signal, the down pulses signal, and the pulse reset signal, wherein the cycle slip circuit is operable to produce a no cycle slips alarm, which indicates whether a cycle slip has occurred.

3. The system of claim 2, wherein the cycle slip circuit (405 of FIG. 6) of the cycle slip detector (405 & 415 of FIG. 6) comprises:

an up cycle slip detector (420) operably coupled to the phase/frequency detector (415) to receive the reference clock, the up pulses signal, and an up pulse reset signal, and to produce an up cycle slips signal in response thereto, thereby indicating whether an up cycle slip has occurred;

a down cycle slip detector (425) operably coupled to the phase/frequency detector (415) to receive the VCO feedback clock, the down pulses signal, and a down pulse reset signal, and to produce a down cycle slips signal in response thereto, thereby indicating whether a down cycle slip has occurred; and a final AND gate (427) operable to logically AND the up cycle slips signal and the down cycle slips signal, and in response thereto, generate a cycle slip detector output which indicates that a cycle slip has taken place.

4. The system of claim 3, wherein the cycle slip circuit (405 of FIG. 6) of the cycle slip detector (405 & 415 of FIG. 6) further comprises:

a counter circuit (430, and 1000) is operably coupled to the final AND gate (427) to receive the cycle slip detector output as a clear signal for the counter, and to the phase/frequency detector (415) to receive the reference clock as a clock signal for the counter, wherein if 16 reference clocks are counted after a cycle slip has been detected, then a feedback line within the counter circuit latches and locks the state of the counter disabling any further counts, and in response thereto, generates an indication that the cycle slip detector has detected a no cycle slips which has persisted for a period of time corresponding to at least 16 reference clocks, otherwise, a cycle slips status is generated.

5. The system of claim 1, wherein the lock detection circuit (300, 400) further comprises logic circuitry (500 of FIG. 7), whereby the no VCO alarm and the no REF alarm are logically combined to form a clocks active status, and the no cycle slips alarm is logically combined with the clocks active status to form a no cycle slips and clocks active status of alarm status from the lock detection circuit for the PLL.

6. The system of claim 1, wherein the clock presence detector (310 of FIG. 4, or 600 of FIG. 8) of the lock detection circuit (300) comprises;

a phase/frequency detector (330) operable to receive a reference clock and a VCO feedback clock, and generate a phase detector reset signal, wherein the phase/frequency detector is operable to detect whether the reference clock, or the VCO feedback clock frequencies are greater, and produce a pulse on the phase detector reset signal output at an edge of the clock with the lower of the two frequencies; and a clock presence circuit (340) operable to receive the reference clock and the VCO feedback clock, and the phase detector reset signal, and to generate a no VCO alarm and a no REF alarm in response thereto, wherein the presence of the reference clock and the VCO feedback clock is detected by determining whether one of the clocks is missing for a time greater than a predetermined count of the other of the remaining clocks, whereby the lock detection circuit provides an alarm indication of the presence of the reference clock and the VCO feedback clock.

7. The system of claim 6, wherein the clock presence detector (310 of FIG. 4, 600 of FIG. 8) of the lock detection circuit (300) further comprises a NOR gate logic circuit, whereby the no VCO alarm and the no REF alarm are logically combined to form the clocks active status from the lock detection circuit for the PLL.

8. The system of claim 6, wherein the clock presence circuit (410 of FIG. 6) of the clock presence detector (310 of FIG. 4, 600 of FIG. 8) comprises:

a negative pulse stretcher circuit (450 of FIG. 6) operably coupled to receive the phase detector reset signal from the phase/frequency detector (4xx), and to generate a stretched phase detector reset signal with a greater pulse width in response thereto; and two counter circuits (430, and 1000) operably coupled to receive the reference clock and the VCO feedback clock, and the stretched phase detector reset signal from the negative pulse stretcher circuit, and to generate the no VCO alarm and the no REF alarm in response to the presence thereto, wherein the stretched phase detector reset signal resets latches in the counter circuits with a negative pulse when both clocks are present, and when one of the clocks is missing, the reset signal remains high, thereby the counters are operable to detect the presence of the reference clock and the VCO feedback clock, by counting to a predetermined count with the other of the remaining clocks and by generating a terminal count which latches and disables the counter, whereby if the terminal count of reference clocks is attained in a counter, a loss of the VCO feedback clock is indicated and the lock detection circuit (300) generates the no VCO alarm, however, if the terminal count of VCO feedback clocks is attained in a counter, a loss of the VCO feedback clock is indicated and the lock detection circuit (300) generates the no REF alarm.

9. The system of claim 8, wherein one of the counter circuits (430, and 1000) of the clock presence circuit (340 of FIG. 4) comprises:

a 4 bit counter (430, and 1000) operably coupled to receive the reference clock or the VCO feedback clock, and the stretched phase detector reset signal from the negative pulse stretcher circuit, and is operable to generate the terminal count of the other of the reference clocks or the VCO feedback clocks in response to the presence thereto;

an inverter operably coupled to the 4 bit counter to receive the reference clock or the VCO feedback clock, and generate an inverted output thereto; and a D type FF operably coupled to the 4 bit counter to receive the terminal count from the 4 bit counter, and the inverter to provide a clear signal, wherein the D type FF is operable to latch the state of the counter circuit at a terminal count of 16 reference clocks or VCO feedback clocks in response to the presence thereof.

10. A method of lock detection for a lock detection circuit of a phase locked loop device comprises:

inputting a reference clock and a VCO feedback clock;

detecting whether a cycle slip has occurred by detecting the frequency difference between the reference clock and the VCO feedback clock that remains for a time period greater than the inverse of the frequency difference of the clocks;

outputting a no cycle slips alarm, based on the result of the frequency difference detection, whereby an indication is provided to the PLL of the lock condition which indicates whether the cycle slip has occurred;

detecting whether the reference clock or the VCO feedback clock is missing for a time greater than a predetermined count of either remaining clock;

outputting a no VCO alarm and a no REF alarm indication to the PLL in response to the presence detection of the reference clock and the VCO feedback clock and count determination, thereby permitting a large variation of the clock phase or frequency and adequate time for the PLL to react to the disturbance without causing false alarms, while providing an alarm to PLL behavior consistent with a significant deviation from the lock condition in a small, low power and low noise digital solution.

11. The method of claim 10, wherein detecting whether a cycle slip has occurred comprises:

detecting the frequency difference between the reference clock and the VCO feedback clock, with a phase/frequency detector, whereby a determination is made whether the reference clock, or the VCO feedback clock frequencies are greater;

generating a pulse width modulated up pulses signal and an up pulse reset signal, and constant negative pulses on a down pulses signal, with the phase/frequency detector, if the frequency of the reference clock is greater than the VCO feedback clock;

generating a pulse width modulated down pulses signal and a down pulse reset signal, and constant positive pulses on the up pulses signal, with the phase/frequency detector, if the frequency of the VCO feedback clock is greater than the reference clock;

producing with a cycle slip circuit, an up cycle slips signal in response to the reference clock, the up pulses signal, and an up pulse reset signal, thereby indicating whether an up cycle slip has occurred;

producing with the cycle slip circuit, a down cycle slips signal in response to the VCO feedback clock, the down pulses signal, and a down pulse reset signal, thereby indicating whether a down cycle slip has occurred; and generating a cycle slip detector output from the cycle slip circuit, which indicates that a cycle slip has taken place by a logical AND of the up cycle slips signal and the down cycle slips signal.

12. The method of claim 10, wherein detecting whether the reference clock or the VCO feedback clock is missing for a time greater than a predetermined count of either remaining clock comprises:

inputting a reset pulse from the phase/frequency detector to the count clear terminal of a counter, whereby the counter is cleared when both the reference clock and the VCO feedback clock are present;

detecting the presence of the reference clock by, up counting an FB_VCO counter with the VCO feedback clock, and determining whether a predetermined count is exceeded, wherein a missing reference clock is indicated and in response, a no REF alarm indication to the PLL is output; and detecting the presence of the VCO feedback clock by, up counting an REF_CLK counter with the reference clock, and determining whether a predetermined count is exceeded, wherein a missing VCO feedback clock is indicated and in response, a no VCO alarm indication is output to the PLL.

13. The method of claim 11, wherein the detecting whether a cycle slip has occurred, and remained for a predetermined time, additionally comprises:

inputting the cycle slip indication from the cycle slip circuit, into the count clear terminal of a cycle slip counter, whereby the counter is cleared when a cycle slip has not taken place;

inputting the reference clock to the clock terminal of the cycle slip counter, whereby the counter is up counted by the reference clock;

detecting the time that the cycle slip has remained in terms of reference clock counts, by up counting the cycle slip counter with the reference clock; and determining whether a predetermined count of the cycle slip counter is exceeded, wherein the inverse of the no cycle slips alarm condition is indicated, and in response thereto, the inverse of the no cycle slips alarm indication is output to the PLL, whereby the lock condition of the lock detector is also conveyed.

* * * * *